United States Patent
Stark et al.

(10) Patent No.: US 10,914,768 B2
(45) Date of Patent: Feb. 9, 2021

(54) VOLTAGE REFERENCE CIRCUIT, VOLTAGE DETECTOR AND VOLTAGE DETECTOR SYSTEM

(71) Applicant: The University of Bristol, Clifton Bristol (GB)

(72) Inventors: Bernard Stark, Bristol (GB); Guang Yang, Bristol (GB); Chunhong Zhang, Xi'an (CN); Plamen Proynov, Bristol (GB); Salah Adami, Clifton Bristol (GB)

(73) Assignee: The University of Bristol, Clifton Bristol (GB)

( * ) Notice: Subject to any disclaimer, the term of this patent is extended or adjusted under 35 U.S.C. 154(b) by 0 days.

(21) Appl. No.: 16/096,771

(22) PCT Filed: Apr. 27, 2017

(86) PCT No.: PCT/GB2017/051184
§ 371 (c)(1),
(2) Date: Oct. 26, 2018

(87) PCT Pub. No.: WO2017/187180
PCT Pub. Date: Nov. 2, 2017

(65) Prior Publication Data
US 2020/0025807 A1    Jan. 23, 2020

(30) Foreign Application Priority Data
Apr. 27, 2016 (GB) .................................. 1607304.1

(51) Int. Cl.
*G01R 19/165* (2006.01)
*G05F 3/24* (2006.01)
(Continued)

(52) U.S. Cl.
CPC ....... *G01R 19/16576* (2013.01); *G01R 15/04* (2013.01); *G01R 19/16519* (2013.01);
(Continued)

(58) Field of Classification Search
None
See application file for complete search history.

(56) References Cited

U.S. PATENT DOCUMENTS

| 5,136,182 A | 8/1992 | Fawal |
| 5,206,581 A | 4/1993 | Yoshida |

(Continued)

FOREIGN PATENT DOCUMENTS

| CN | 202711108 | 10/2012 |
| EP | 0433696 | 8/1991 |

(Continued)

OTHER PUBLICATIONS

S.Y. Wu; IEEE International Conference of Electron Device and Solid-state circuits, Design and realization of a voltage detector based on current comparison in a 40nm technology, 2013, p. 1-2.
(Continued)

*Primary Examiner* — Jas A Sanghera
(74) *Attorney, Agent, or Firm* — Burns & Levinson, LLP; George N. Chaclas

(57) ABSTRACT

A voltage detector (200) for monitoring an input signal and outputting a detection signal at an output when a voltage of the input signal meets a first threshold having: an input configured for receiving the input signal; a voltage reference circuit for receiving an input voltage and producing a reference voltage having a maximum value independent of the input voltage; and a trigger configured to compare the input signal and the reference voltage and to output a detection signal to the output when the voltage of the input
(Continued)

signal reaches the first threshold. The voltage reference circuit comprises a reset input connected to either the input or the output and is configured to reduce the reference voltage when a predetermined reset signal is received. The voltage reference circuit may include: an input for receiving the input voltage; a first current controlling element (210), such as a diode, which allows current to flow as an increasing, non-linear function of voltage at least within a first range of voltages; a second current controlling element (240), such as a transistor, which allows current to flow as an increasing, non-linear function of voltage at least with a second range of voltages; and an output at which the output reference voltage is produced. The first current controlling element and the second current controlling element are connected in series between the input and a common reference, with the second current controlling element between the first current controlling element and a common reference, the output comprises a node between the two current controlling elements, the first and second range of voltages overlap and the second current controlling element is configured to vary the function by which it allows current to flow in dependence on the input voltage.

19 Claims, 20 Drawing Sheets

(51) Int. Cl.
*H03K 17/22* (2006.01)
*G01R 15/04* (2006.01)
*G05F 3/10* (2006.01)

(52) U.S. Cl.
CPC ......... *G01R 19/16538* (2013.01); *G05F 3/10* (2013.01); *G05F 3/24* (2013.01); *H03K 17/223* (2013.01)

(56) References Cited

U.S. PATENT DOCUMENTS

| | | | |
|---|---|---|---|
| 6,545,510 | B1* | 4/2003 | Cowles ............ G01R 19/16519 327/74 |
| 2007/0001714 | A1* | 1/2007 | Zolfaghari ....... G01R 19/16552 327/77 |
| 2010/0283516 | A1 | 11/2010 | Choi |
| 2011/0095789 | A1 | 4/2011 | Tang et al. |
| 2012/0283516 | A1 | 11/2012 | Kang et al. |
| 2012/0323508 | A1 | 12/2012 | Boas Vilas et al. |
| 2017/0077921 | A1* | 3/2017 | Yem ..................... H03K 5/1534 |

FOREIGN PATENT DOCUMENTS

| | | |
|---|---|---|
| EP | 0718740 | 7/1996 |
| EP | 2320295 | 5/2011 |
| GB | 2308453 | 6/1997 |
| JP | 58196464 | 11/1983 |
| JP | 61101821 | 5/1986 |
| WO | 2015/072522 | 5/2015 |

OTHER PUBLICATIONS

International Search Report and Written Opinion for PCT Application No. PCT/GB2017/051184, dated Nov. 6, 2017, 17 pages.

\* cited by examiner

VOLTAGE REFERENCE CIRCUIT, VOLTAGE DETECTOR AND VOLTAGE DETECTOR SYSTEM

CROSS-REFERENCE TO RELATED APPLICATIONS

This application is the U.S. national phase entry under 35 U.S.C. § 371 of International Application No. PCT/GB2017/051184, filed Apr. 27, 2017, entitled VOLTAGE REFERENCE CIRCUIT, VOLTAGE DETECTOR AND VOLTAGE DETECTOR SYSTEM, which in turn claims priority to and benefit of Great Britain Application No. 1607304.1, filed Apr. 27, 2016; each of which is incorporated herein by reference in their entirety for all purposes.

TECHNICAL FIELD

The present application relates to a voltage reference circuit, a voltage detector and a voltage detector system.

BACKGROUND TO THE INVENTION

Voltage reference circuits find application as part of a wide range of electronic circuits including sensing, comparison, low voltage logic and op amp circuits and Schmidt triggers.

In the context of sensing, sensors such as those used in medical devices can be powered by wireless power transfer or energy harvesting sources. In the case of sensors that are worn on the human body, these sources provide intermittent power due to the body's movement. For example, if the wearer of the device rests in a position such that a power receiving antenna is poorly oriented relative to the transmitter, then an input power lull occurs. This problem of intermittency occurs with the majority of energy generation and wireless power transfer techniques, and is only exacerbated when some of the system is situated on a moving body.

FIG. 1 provides a schematic illustration of a sensor system that may be powered by intermittent sources. The intermittent source feeds an input rail $V_{IN}$. A power management circuit converts $V_{IN}$ into a useful stable internal rail voltage $V_{DD}$ for the sensor sub-systems. The power management circuit requires power for its own internal control circuits, which is supplied from the $V_{DD}$ rail. In order to stop this quiescent power from unnecessarily draining power from the $V_{DD}$ rail, the power management is powered off during input power lulls. A voltage detector, the device under consideration here, senses the input voltage $V_{IN}$, and power-gates the power management circuit via a PMOS transistor, which is switched by the voltage detector's open-drain output Enable. Three-terminal voltage detectors are used that do not require connection to a supply rail, and therefore, in principle provide always-awake input monitoring, even when the rest of the sensor system is powered off.

Alternatively, as shown in FIG. 1, the voltage detector could be used to switch on a power supply, for example from a battery, thus minimising use of stored power to when there is a detection signal.

In practice, however, existing commercially-available voltage detectors have a significant input quiescent current, especially once activated. This quiescent current significantly reduces the source's output voltage, and thus prevents the use of wireless rectifying antennas (rectennas) with multiple voltage multiplying stages, and wearable energy harvesters such as ferroelectret textiles, because these have high source impedances of up to tens of MΩ. For these sources, input monitoring and input-dependent power gating is therefore not currently possible.

This problem is illustrated in FIG. 2, which shows the operation of a commercially available voltage detector being used in the circuit of FIG. 1. FIG. 2 shows the source voltage $V_{IN}$ when the source is unloaded (dashed line), and also when loaded by the voltage detector (solid line). On reaching the detector's threshold, the quiescent current $I_{IN}$ increases sharply, dragging the input voltage down, thus switching the detector off again. The quiescent input current drops and the process begins again, resulting in a pulsing output $V_{OD}$ rather than an output pulse that lasts the duration of the incoming power, as required for the power-gating of sensor sub-systems. More importantly, the source voltage $V_{IN}$ has been affected in such a way that the supply to the power management circuit shown in FIG. 1 is significantly reduced.

Another potential solution is the Power-On-Reset circuit (POR), which monitors an input without the need for a stable voltage rail. FIG. 3 illustrates the operation of a basic POR pulse generator circuit. However, the output is a short reset-pulse, which does not provide information on the duration of the incoming source power.

FIG. 4 shows the desired behaviour of an ideal voltage detector, where the incoming voltage is preserved, the quiescent current is zero most of the time, and the output lasts the duration of the incoming power.

Many different types of low-power integrated circuits for monitoring voltage rails have been proposed, including those previously referred to. In one such circuit (as described in "A 330 nA energy-harvesting charger with battery management for solar and thermoelectric energy harvesting" by K. Kadivrl et al) a voltage detector consists of a comparator and a band-gap reference to determine the input condition. However, the quiescent current of this circuit is 180 nA, mostly due to continuous flow of bias current through reference-voltage generating circuitry and the comparator. The voltage detection threshold of this circuit is 2.1V and the maximum operating voltage is 4V. Additional protection circuits could be used to protect the circuit from potentially damaging over voltage conditions, but by clamping the input voltage at 4V, a significant percentage of the source power would be lost.

A monitoring circuit consuming sub-nA current has also been proposed (Toshishige Shimamura, Mamoru Ugajin, Kenji Suzuki, Kazuyoshi Ono, Norio Sato, Kei Kuwabara, Hiroki Morimura, Shin'ichiro Mutoh: "Nano-Watt Power Management and Vibration Sensing on a Dust-Size Battery-less Sensor Node for Ambient Intelligence"). It operates without the need for a bandgap voltage reference for low power, but triggers only at a high input voltage.

Detectors which do not need comparators have been proposed, (e.g. by P. Chen, et al: "Startup Techniques for 95 mV Step-Up Converter by Capacitor Pass-On Scheme and $V_{TH}$-Tuned Oscillator with Fixed Charge Programming" and X. Zhang et al: "A 0.6 V Input CCM/DCM Operating Digital Buck Converter in 40 nm CMOS"). Their quiescent current is therefore reduced to few nA. The technology used permits detection thresholds of a few hundred mV, but this also reduces the maximum allowed input voltage.

In "Design and Realization of a Voltage Detector Based on Current Comparison in a 40 nm Technology" by S. Y. Wu, W. B. Chen, N. Ning, J. Li, Y. Liu, and Q. Yu, a current comparison voltage detector is reported, which uses current comparison instead of a voltage comparator. The current reference is programmed by a logic control circuit, and provides the detector with three selectable thresholds. The power, however, is high at µW and the voltage detection threshold is 1.1V.

A battery supervisor circuit consuming 635 pW at 3.6 V is reported in "A 635 pW Battery Voltage Supervisory Circuit for Miniature Sensor Nodes" by I. Lee, S. Bang, Y. Lee, Y. Kim, G. Kim, D. Sylvester, and D. Blaauw. This circuit achieves low power consumption through a 57 pA voltage reference and a low power comparator. The detection threshold, however, is 3.6 V, which is too high for many applications. In "248 pW, 0.11 mV/° C. Glitch-Free Programmable Voltage Detector With Multiple Voltage Duplicator for Energy Harvesting" by Teruki Somey, Hiroshi Fuketa, Kenichi Matsunaga, Hiroki Morimura, Takayasu Sakurai, and Makoto Takamiya, a 248 pW voltage detector for energy harvesting is demonstrated. However, its maximum input voltage is 0.1 V, which is too low for many applications.

As will be appreciated from the discussion above, existing commercial discrete voltage detectors and integrated detection circuits are unsuitable for the continuous, non-invasive monitoring of high-impedance source voltages. A need therefore exists for a voltage detector which combines a high (greater than 10V) maximum input voltage, a low (lower than 1V) detection threshold and a low (lower than 248 pW) quiescent power consumption.

It is an object of embodiments of the present invention to provide a voltage reference circuit suitable for use in a voltage detector, as well as other applications, a voltage detector and a voltage detector system that address the problems of the prior art.

SUMMARY OF INVENTION

According to a first aspect of the invention there is provided a voltage reference circuit for receiving an input and producing an output reference voltage having a maximum value independent of a voltage of the input, the circuit comprising:
  an input for receiving the input voltage;
  a first current controlling element which allows current to flow as an increasing, non-linear function of voltage at least within a first range of voltages;
  a second current controlling element which allows current to flow as an increasing, non-linear function of voltage at least with a second range of voltages; and
  an output at which the output reference voltage is produced,
  wherein the first current controlling element and the second current controlling element are connected in series between the input and a common reference, with the second current controlling element between the first current controlling element and the common reference, the output comprises a node between the two current controlling elements, the first and second range of voltages overlap and the second current controlling element is configured to vary the function by which it allows current to flow in dependence on the input voltage.

This structure allows a voltage reference to be generated with a very low current consumption.

The first and/or second current controlling elements may allow current to flow as a substantially exponential function of voltage, at least within the first and second ranges of voltages respectively. The function may be that provided by a semiconductor device operating in subthreshold mode, i.e. in a range of voltages below a threshold voltage of the device.

The first current controlling element could also be regarded as a voltage reducing element and may be a diode, a transistor or a diode connected transistor.

The second current controlling element may be a transistor, particularly an NMOS transistor.

The second current controlling element may have a control terminal connected to the input, thereby to control current flow (in particular to vary the function by which the element allows current to flow with voltage) in dependence on the input voltage.

The common reference may be ground.

The voltage reference circuit may further comprise a reset input for receiving a reset signal and/or a third current controlling element connected in series between the first current controlling element and the output. The third current controlling element may be configured to allow current to flow in dependence on a voltage received at the reset input. The reset input may be connected to the input so that the third current controlling element is configured to allow current to flow in dependence on the input voltage.

The third current controlling element may be arranged to reduce or substantially prevent current flowing through the reference circuit when a predetermined reset signal is received. This effectively allows the reference circuit to be turned off when a voltage reference is no longer required, thereby saving current.

The third current controlling element may allow current to flow as an increasing, non-linear function of voltage at least with a third range of voltages, and to vary that function in dependence on a reset signal received at the reset input.

The third current controlling element may be a transistor, particularly a PMOS transistor.

The third current controlling element may have a control terminal connected to the reset input.

Alternatively the first, second and/or third current controlling element may be a network comprising any number of any of the following components: diodes, transistors and/or diode connected transistors. So, the first, second and/or third current controlling element could be or comprise an exponential trans-conductor cell. Such networks would be configured to provide the desired properties of the current controlling elements.

The voltage reference circuit may be arranged to reduce the output reference voltage, such as substantially to the common reference level, when a predetermined reset signal is received.

The voltage reference circuit may comprise a capacitance connected to the input via the first current controlling element. Where a third current controlling element is provided it may be connected to a node between the first current controlling element and the capacitance.

A bias-shifting element may be associated with any of the current controlling elements. In one arrangement a diode-connected transistor is connected between the second current controlling element and the common reference.

The voltage reference circuit according to the first aspect of the invention has a wide variety of applications, including use in place of conventional voltage reference generating circuits. One application is in a voltage detector where it is connected to a trigger configured to compare the input voltage with the output reference voltage and to output a detection signal when the voltage of the input meets a first threshold.

According to a second aspect of the present invention there is provided a voltage detector for monitoring an input signal and outputting a detection signal at an output when a voltage of the input signal meets a first threshold, the voltage detector comprising:
an input configured for receiving the input signal;
a voltage reference circuit for receiving an input voltage and producing a reference voltage having a maximum value independent of the input voltage; and
a trigger configured to compare the input signal and the reference voltage and to output a detection signal to the output when the voltage of the input signal reaches the first threshold,
wherein the voltage reference circuit comprises a reset input connected to either the input or the output and is configured to reduce the reference voltage when a predetermined reset signal is received.

Provision of a reset facility effectively allows the detector to be switched off when triggered, thus saving current in certain implementations.

The voltage reference circuit comprised in the voltage detector may be according to the first aspect of the invention.

The trigger may be an inverter which may comprise a PMOS transistor and an NMOS transistor.

In this arrangement, reduction of the reference voltage can help reduce current leakage through the trigger following triggering.

The reference voltage produced by the voltage reference circuit may be low enough to ensure that the inverter is in subthreshold mode when it switches.

The voltage reference circuit may act as a switch for selectively connecting an input of the inverter to the capacitance, where provided, or to a common reference, wherein: the switch is operative to connect the input of the inverter to the capacitance during a period in which a voltage of the input signal rises from zero to the first threshold, such that no detection signal is output; the switch is operative to connect the input of the inverter to a common reference when the voltage of the input signal meets the first threshold, such that a detection signal is output while the voltage of the input signal is equal to or greater than the first threshold; and the switch is operative to connect the input of the inverter to the capacitance when the voltage of the input signal drops below a second threshold, such that no detection signal is output.

There may be one or more buffers between the trigger and the output. These can sharpen the response of the detector. That is they provide for a more rapid rise or fall of the ultimate output on triggering of the inverter.

The voltage detector may be configured to stop outputting a detection signal when a voltage of the input falls below a second threshold which is lower than the first threshold. Advantageously, where the trigger is an inverter this is achieved by the reduction in the reference voltage on triggering of the inverter.

According to a third aspect of the invention there is provided a voltage detector system for monitoring an input signal and outputting a detection signal when the voltage of the input signal meets a threshold, the voltage detector system comprising:
a first voltage detector having a first reference generator and an input for receiving the input signal and an output for outputting a detection signal, wherein the first voltage detector is configured to output the detection signal when the voltage of the input signal meets a first rising input voltage threshold;
a second voltage detector having a second reference generator and an input for receiving the input signal and an output for outputting a detection signal, wherein the second voltage detector is configured to output the detection signal when the voltage of the input signal meets a second rising input voltage threshold which is higher than the first threshold,
wherein the output of the second voltage detector controls a connection between the input signal and the input of the first voltage detector such that when the voltage of the input signal meets the second rising input voltage threshold the connection between the input signal and input of the first voltage detector is restricted or disconnected.

The voltage detector system may further comprise a third voltage detector having a third reference generator and an input for receiving the input signal and an output for outputting a detection signal, wherein the third voltage detector is configured to output a detection signal when the voltage of the input signal meets a third rising input voltage threshold which is higher than both the first threshold and the second threshold, wherein the output of the third voltage detector controls a connection between the input signal and the input of the second voltage detector such that when the voltage of the input signal meets the third rising input voltage threshold the connection between the input signal and the input of the second voltage detector is restricted or disconnected.

The first voltage detector may be configured to cease outputting a detection signal when the voltage of the input signal meets a first falling input voltage threshold, wherein the first falling input voltage threshold is lower than the first rising input voltage threshold.

The second voltage detector may be configured to cease outputting a detection signal when the voltage of the input signal meets a second falling input voltage threshold, wherein the second falling input voltage threshold is lower than the second rising input voltage threshold.

The third voltage detector may be configured to cease outputting a detection signal when the voltage of the input signal meets a third falling input voltage threshold, wherein the third falling input voltage threshold is lower than the third rising input voltage threshold.

The voltage detector system may further comprise an open drain output stage, the output stage comprising a plurality of MOSFET devices, each MOSFET device having: a gate terminal connected to an output of a respective one of the voltage detectors; a source terminal connected to a common reference; and a drain terminal connected to an output terminal of the output stage.

A gate threshold of each MOSFET device may be lower than the rising input threshold and the falling input threshold of the respective voltage detector to which the MOSFET device is connected.

Any or all of the voltage detectors of the voltage detector system may be according to the second aspect of the invention.

Voltage detector systems of the present invention may have a steady quiescent current of units to tens of picoamps prior to triggering, which enables continuous monitoring of the output of sources with impedances in the MΩ range. Once triggered, the quiescent current may be tens to hundreds of picoamps. Additionally, voltage detector systems of the present invention can have a low threshold voltage, and so be able to capture as many power-containing pulses as possible, whilst at the same time have a high maximum input voltage, again allowing capture of higher power pulses without sustaining damage. Further, leakage current from or into the voltage detector is minimal.

According to a fourth aspect of the invention there is provided a voltage detector for monitoring an input signal and outputting a detection signal when a voltage of the input signal meets a first threshold, the voltage detector comprising: an input configured for receiving the input signal; a capacitance which is charged by the input signal; an inverter having an output for outputting the detection signal; and a switch for selectively connecting an input of the inverter to the capacitance or to ground, wherein: the switch is operative to connect the input of the inverter to the capacitance during a period in which a voltage of the input signal rises from zero to the first threshold, such that no detection signal is output; the switch is operative to connect the input of the inverter to ground when the voltage of the input signal meets the first threshold, such that a detection signal is output while the voltage of the input signal is equal to or greater than the first threshold; and the switch is operative to connect the input of the inverter to the capacitance when the voltage of the input signal drops below a second threshold, such that no detection signal is output.

The voltage detector may further comprise a voltage reducing element through which the capacitance is charged by the input signal. The switch may be controlled by the output of the inverter. The switch may comprise a transistor for connecting the input of the inverter to the capacitor, the transistor having a control terminal connected to the output of the inverter such that operation of the transistor is controlled by the output of the inverter. The switch may further comprise a further transistor for connecting the input of the inverter to ground, the further transistor having a control terminal connected to the input so as to receive the input signal, such that operation of the further transistor is controlled by the input signal. The switch may be controlled by the input signal. The switch may comprise a transistor for connecting the input of the inverter to the capacitor, the transistor having a control terminal connected to the input so as to receive the input signal, such that operation of the transistor is controlled by the input signal. The switch may further comprise a further transistor for connecting the input of the inverter to ground, the further transistor having a control terminal connected to the input so as to receive the input signal, such that operation of the further transistor is controlled by the input signal. The voltage detector may further comprise a bias-shifting element associated with the further transistor, the bias-shifting element being operative to bias the control terminal of the further transistor. The bias-shifting element may comprise a diode-connected transistor connected between the further transistor and ground. The inverter may comprise a PMOS transistor and an NMOS transistor. The further transistor may comprise an NMOS transistor, and wherein the rising input voltage threshold of the voltage detector is defined by a gate threshold voltage of the NMOS transistor.

Features of the fourth aspect of the invention may be combined with any of those of the second and first aspects of the invention.

BRIEF DESCRIPTION OF THE DRAWINGS

Embodiments of the invention will now be described, strictly by way of example only, with reference to the accompanying drawings, of which.

DESCRIPTION OF THE EMBODIMENTS

Figure 1:
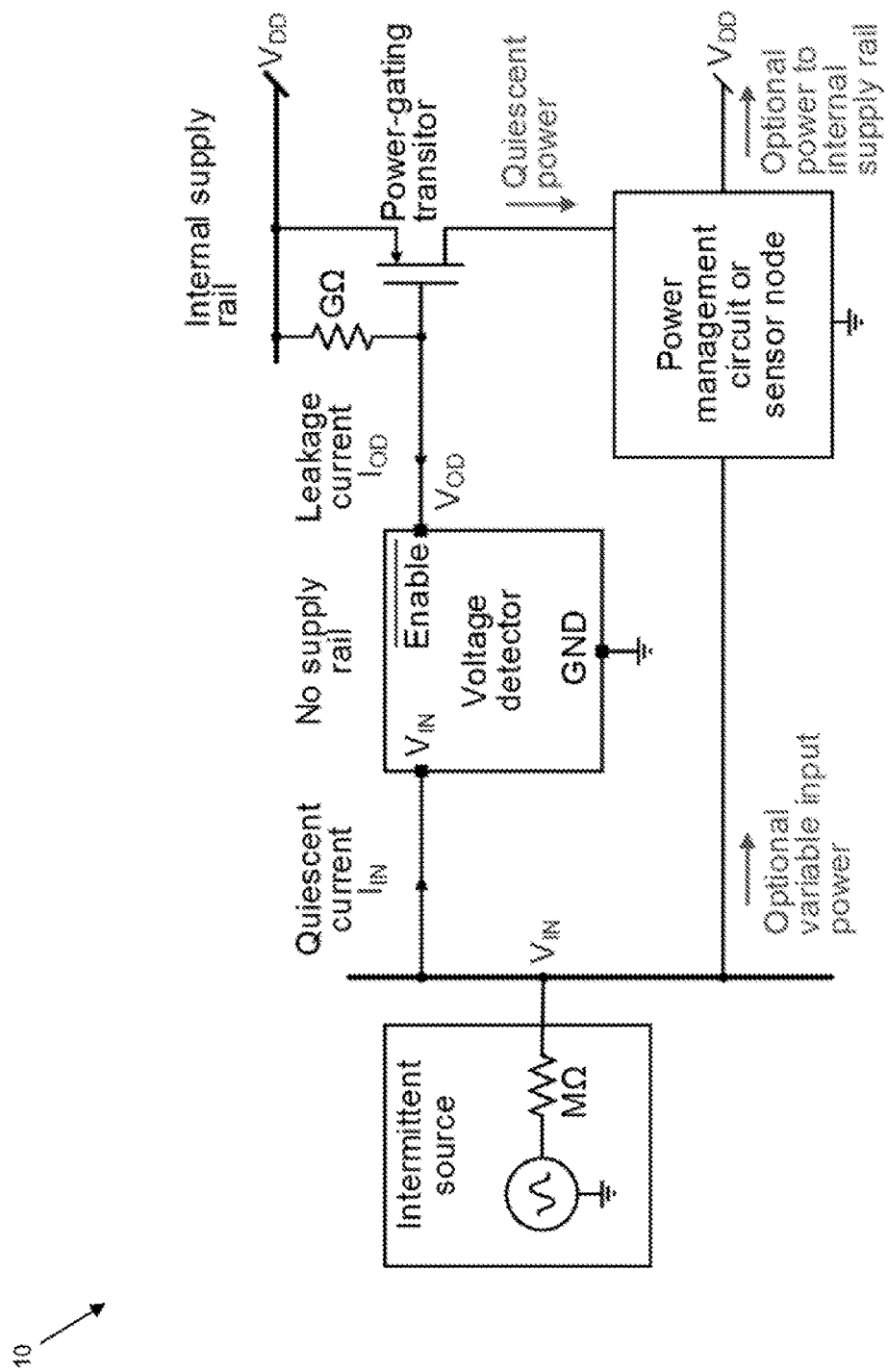
FIG. 1 is a schematic representation of a sensor system that is powered by intermittent sources.
Figure 2:
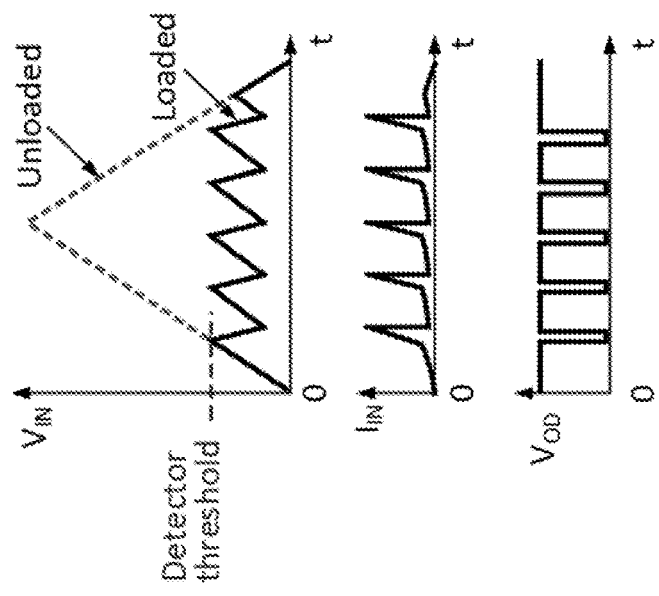
FIG. 2 illustrates the operation of a commercially available voltage detector as used in the circuit of FIG. 1.
Figure 3:
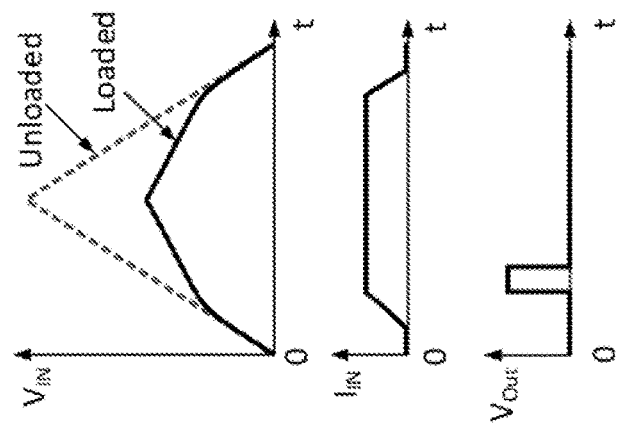
FIG. 3 illustrates the operation of a basic power on reset (POR) pulse generator circuit.
Figure 4:
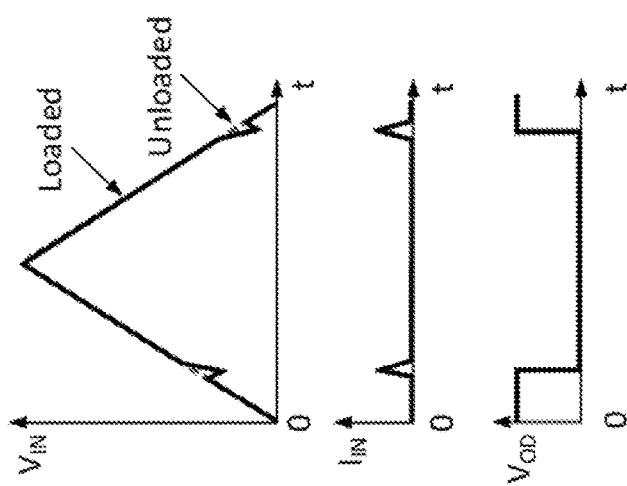
FIG. 4 illustrates the ideal behaviour of a POR circuit.
Figure 5:
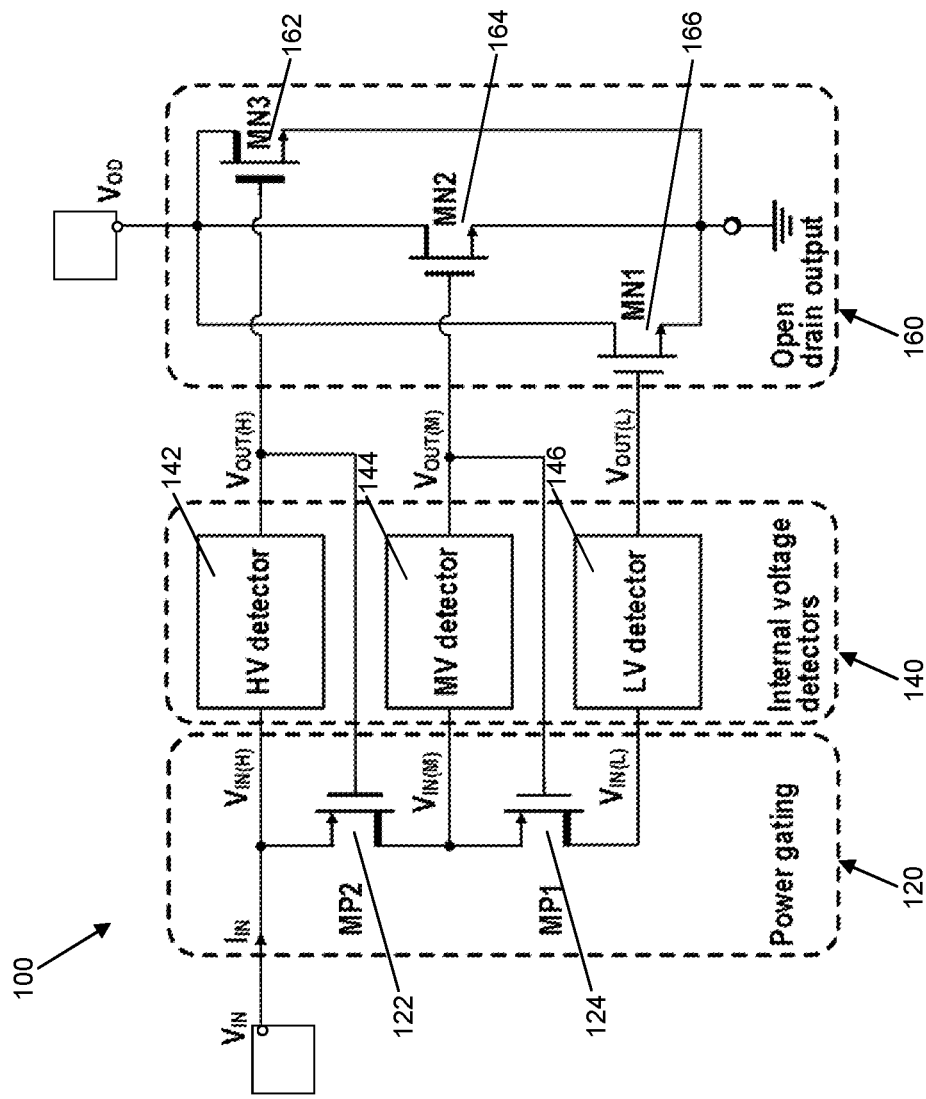
FIG. 5 is a schematic representation of a system architecture of a system incorporating a plurality of voltage detectors.

FIG. 5 illustrates a voltage detection system which combines all the desired properties of voltage detectors, namely high maximum input voltage, a low voltage detection threshold and low quiescent power consumption. The system, shown generally at 100 in FIG. 5, includes a power gating stage 120, a voltage detection stage 140 and an output stage 160.

The voltage detection stage 140 includes a first voltage detector 142 which is configured to detect input voltages in a high voltage range (e.g. in the range 2.8 volts to 20 volts), a second voltage detector 144 which is configured to detect input voltages in a medium voltage range (e.g. 0.6 volts to 2.8 volts) and a third voltage detector 146 which is configured to detect input voltages in a low voltage range (e.g. 0.45 volts to 0.6 volts). This arrangement of three voltage detectors ensures that the voltage detection system 100 is able to operate in a wide input voltage range, therefore facilitating the capture of energy from pulses with a wide power range.

The power gating stage 120 is configured to prevent potentially damaging input voltages from reaching the second and third voltage detectors 144, 146, and is arranged such that the first voltage detector 142 gates the second and third voltage detectors 144, 146 and the second voltage detector 144 gates the third voltage detector 146. As can be seen in FIG. 5, the voltage input $V_{IN}$ of the system 100 is connected to an input $V_{IN}(H)$ of the first voltage detector 142. An output $V_{OUT(H)}$ of the first voltage detector 142 is connected to the gate terminal of a first P-channel MOSFET 122. The source terminal of the first P-channel MOSFET is connected to the voltage input $V_{IN}$ and the drain terminal of the first P-channel MOSFET 122 is connected to an input $V_{IN(M)}$ of the second voltage detector 144, and, via a second P-channel MOSFET 124, to an input $V_{IN(L)}$ of the third voltage detector 146.

When the first voltage detector 142 detects an input voltage in the high voltage range, its output $V_{OUT(H)}$ goes high, causing the first P-channel MOSFET 122 to switch off, thereby restricting or preventing the input voltage from reaching the second voltage detector 144 or the third voltage detector 146.

Similarly, the gate terminal of the second P-channel MOSFET 124 is connected to an output $V_{OUT(m)}$ of the second voltage detector 144, such that when the second voltage detector 144 detects an input voltage in the medium voltage range, its output $V_{OUT(M)}$ goes high, causing the second P-channel MOSFET 124 to switch off, thereby restricting or preventing the input voltage from reaching the third voltage detector 146.

The output stage 160 of the voltage detection system 100 includes (in the illustrated example) first, second and third N-channel MOSFETS 162, 164, 166. The gate terminal of the first N-channel MOSFET 162 is connected to the output $V_{OUT(H)}$ of the first voltage detector 142, whilst the gate terminal of the second N-channel MOSFET 164 is connected to the output $V_{OUT(M)}$ of the second voltage detector 144 and the output of the third N-channel MOSFET 166 is connected to the output $V_{OUT(L)}$ of the third voltage detector 146.

The drain terminals of the first, second and third N-channel MOSFETs 162, 164, 166 are all connected to an open-drain output terminal $V_{OD}$ of the output stage 160, whilst the source terminals of the first, second and third N-channel MOSFETs 162, 164, 166 are all connected to ground. Accordingly, if any one of the first, second or third voltage detectors 142, 144, 146 is triggered, the open drain output $V_{OD}$ of the output stage 160 will be activated.

Figure 6:
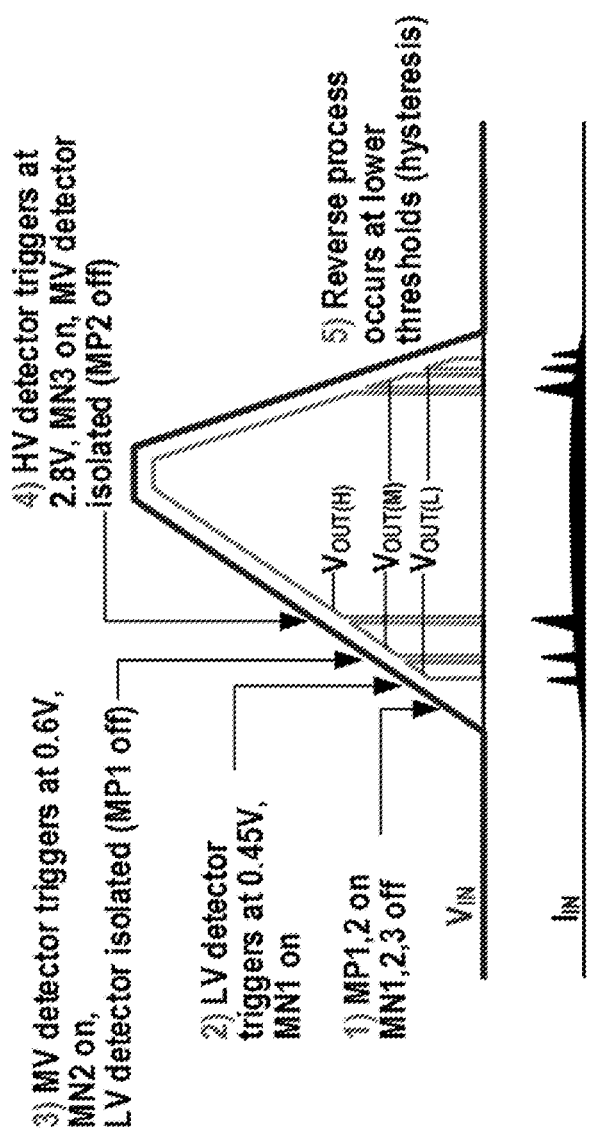
FIG. 6 is a timing diagram illustrating the operation of the system of FIG. 5.

FIG. 6 is a timing diagram illustrating the operation of the circuit of FIG. 5. The input voltage $V_{IN}$ is shown as a trapezoidal pulse. As the rising edge of this pulse reaches the voltage detection threshold of the third (low voltage range) voltage detector 146, the third voltage detector 146 turns the third N-channel MOSFET 166 on, activating the system's output $V_{OD}$. When the input voltage $V_{IN}$ reaches the voltage detection threshold of the second (medium voltage range) voltage detector 144, the second voltage detector 144 switches on the second N-channel MOSFET 164, and power-gates off the third voltage detector 146, thus protecting it from a further rise in $V_{IN}$, and causing the third N-channel MOSFET 166 to be switched off. As $V_{IN}$ reaches the voltage detection threshold of the first (high voltage range) voltage detector 142, the first N-channel MOSFET 162 is switched on, and both the second and third voltage detectors 144, 146 are disconnected from the input (or at least the connection restricted), resulting in the turning off of the second N-channel MOSFET 164. The first voltage detector 142 remains active until the input voltage drops below its voltage detection threshold, which leads to the second voltage detector 144 being powered on. A further fall in the input voltage activates the third voltage detector 146.

The thresholds at which the voltage detectors 142, 144, 146 switch on in response to a rising input voltage may be different from (higher than) the thresholds at which the voltage detectors 142, 144, 146 switch off in response to a falling input voltage, in order to provide hysteresis and thus avoid system oscillation. The overall result is a continuous activation of the open-drain output $V_{OD}$ for the duration of the input pulse. To ensure seamless operation of the voltage detection system 100, the threshold voltage of each MOSFET device 162, 164, 166 should be lower than the detection thresholds at which the respective voltage detectors 142, 144, 146 switch on in response to a rising input voltage and the thresholds at which the respective voltage detectors 142, 144, 146 switch off in response to a falling input voltage.

This illustrates the reason for using an open-drain output. When activated, the voltage outputs $V_{OUT(H)}$, $V_{OUT(M)}$ and $V_{OUT(L)}$ of the voltage detectors 142, 144, 146 are at the same potential as their corresponding inputs $V_{IN(H)}$, $V_{IN(M)}$ and $V_{IN(L)}$). Since the voltage detector system 100 will interface to other CMOS devices with much lower maximum allowable voltages, $V_{OUT(H)}$ and $V_{OUT(M)}$ cannot be used as the output of the overall system. The open drain output stage allows the voltage detector system 100 to output a signal that is usable by, and not damaging to, an external device.

FIG. 6 also illustrates the profile of the total quiescent current $I_{IN}$ of the voltage detector system 100. $I_{IN}$ is zero when the input voltage $V_{IN}$ is zero, and on a rising input voltage the current increases from 42 pA at 0.2V (below the voltage detection threshold of the third voltage detector 146) to 83 pA at $V_{IN}$=1V (above the detection threshold of the second voltage detector 144), and to around 236 pA at $V_{IN}$=5V (above the detection threshold of the first voltage detector 142), with current surges occurring at the activation points of each of the three voltage detectors 142, 144, 146. The measured total energy loss per transition caused by static current when an input voltage rises from 0 to 2.8V, a voltage slightly higher than the high detection threshold (2.8V) with two typical gradients of 1V/s and 100V/s respectively are 788 pJ and 7.9 pJ respectively. This is lower than prior art voltage detection circuits, which contain circuits that, for a given rail voltage, continuously consume quiescent current. An alternative version of the voltage detector system 100 in which the third voltage detector 144 is disabled draws 1.2 pA at 0.2V, around 6 pA at 1V and 111 pA at 5V. Its total energy consumption at 1V/s and 100V/s transition from 0 to 2.8V of the input voltage is 229 pJ and 23 pJ respectively.

Figure 7:
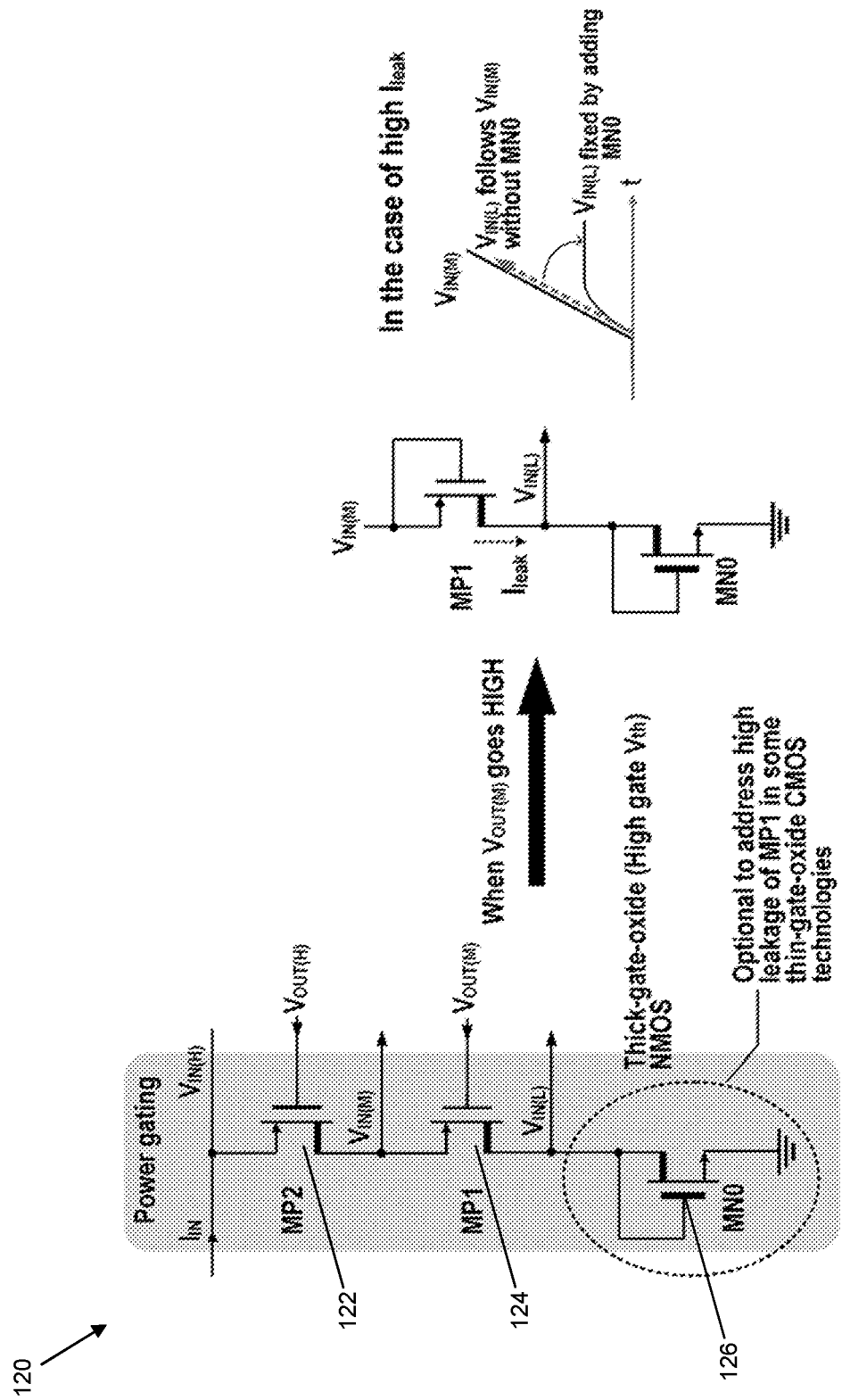
FIG. 7 is a schematic representation of a power-gating circuit suitable for use in the architecture of FIG. 5.

FIG. 7 is a schematic representation of a power-gating circuit 120 suitable for use in the voltage detection system 100 of FIG. 5. The power-gating transistor 122 should be a medium-gate-oxide (5.5 V breakdown) PMOS transistor because its source-gate voltage can be as high as 2.8 V (corresponding to the threshold of the first voltage detector 142) before its gate-drive signal goes high. By contrast, the power-gating transistor 124 can be a thin-gate-oxide PMOS transistor because its source-gate voltage does not exceed 0.6 V (corresponding to the threshold of the second voltage detector 144) and its low gate-threshold voltage helps the third (low voltage range) detector 146 start to operate at a low input voltage.

Ideally, the input voltage $V_{IN(L)}$ of the third detector 146 will drop after the transistor 122 is switched off for protecting this detector. However, in some thin-gate-oxide CMOS process technologies, the leakage current through the transistor 124 (when 'OFF') can be sufficiently high so that $V_{IN(L)}$ can continue to rise and follow the input voltage $V_{IN(M)}$ of the second (medium voltage range) detector 144.

This may cause overvoltage damage to the third detector 146 especially when $V_{IN(M)}$ has a slow voltage gradient.

Figure 8:
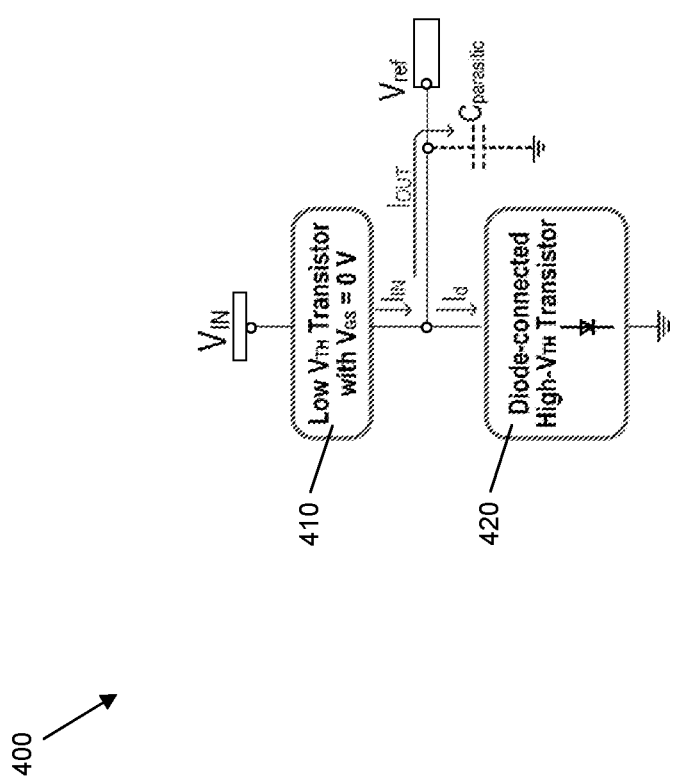
FIG. 8 is a schematic representation of a voltage reference circuit that forms a part of the architecture of FIG. 5.

A simple but efficient protection solution is to add a route to ground (or a common reference) for the leakage current. In the power gating circuit 120 of FIG. 7, this is implemented with a diode-connected NMOS transistor 126 (labelled MN0), which is a thick-gate-oxide (high gate-threshold) transistor. When the second voltage detector 144 output $V_{OUT(M)}$ goes high, which switches off the transistor 124 (zero gate-source voltage), the two transistors 124 and 126 are configured as an ultra-low-power two-transistor voltage reference consisting of two stacked transistors 124, 126 with different gate thresholds $V_{TH}$ as shown in FIG. 8. The first one 410 of the stacked transistors has a lower $V_{TH}$ and zero gate-source voltage, whilst a second one 420 of the stacked transistors has higher $V_{TH}$ and is configured as a diode-connected transistor. The reference circuit 400 clamps $V_{IN(L)}$ to a fixed voltage (seen as a voltage plateau in the graph of FIG. 7) while consuming pico-amperes current only, and by adjusting the W/L ratios of transistors 124 and 126, $V_{IN(L)}$ can be set at a safe voltage for the third voltage detector 146. Before transistor 124 is switched off and while the third voltage detector 146 is operating normally, transistor 126 draws negligible current from the input $V_{IN(L)}$ because its gate-threshold is much higher than $V_{IN(L)}$ and thus this transistor operates in its deep subthreshold region.

Figure 9:
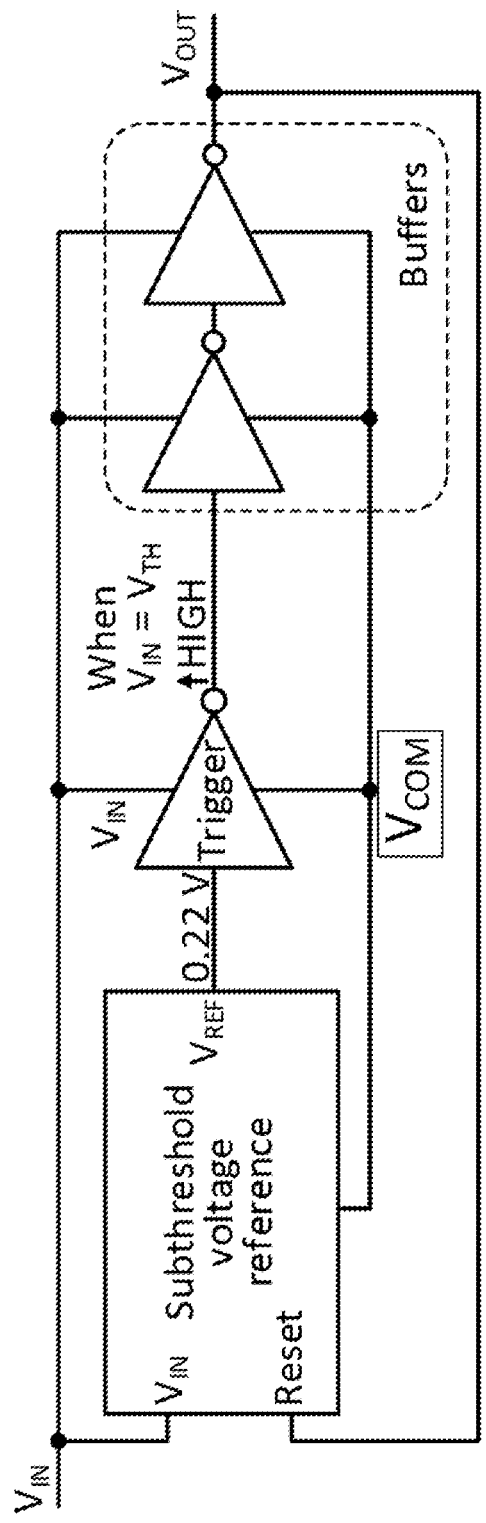
FIG. 9 is a functional block diagram of a voltage detector used in the system of FIG. 5.

FIG. 9 is a schematic block diagram illustrating the desired functionality of the voltage detectors 142, 144, 146 used in the system 100.

As can be seen from FIG. 9, each of the voltage detectors 142, 144, 146 comprises a subthreshold voltage reference, a trigger circuit and optional output buffers. The subthreshold voltage reference seeks to generate a fixed output $V_{REF}$, in this example 0.22 V. The trigger comprises an inverter with input $V_{REF}$ and its supply the varying detector input voltage $V_{IN}$. The trigger switches its output to high as the supply voltage $V_{IN}$ reaches the detection threshold $V_{TH}$. Its input $V_{REF}$ is sufficiently low to ensure that the trigger is still in subthreshold mode when it switches.

The optional output buffers sharpen the response of the detector and feed the output back to the Reset input of the subthreshold voltage reference. On triggering the detector, the low-to-high transition of the output activates the Reset input of the subthreshold voltage reference. This has three beneficial effects. First, it cuts off or at least substantially reduces the static quiescent current draw of the subthreshold voltage reference. Second, the reference output is pulled to the common reference, which virtually eliminates static current in the trigger, as its input is no longer at an intermediate voltage. Third, with a lower (or grounded) input, the trigger switches its output back at a lower $V_{IN}$ threshold, which inherently provides the detector with hysteresis.

Figure 10:
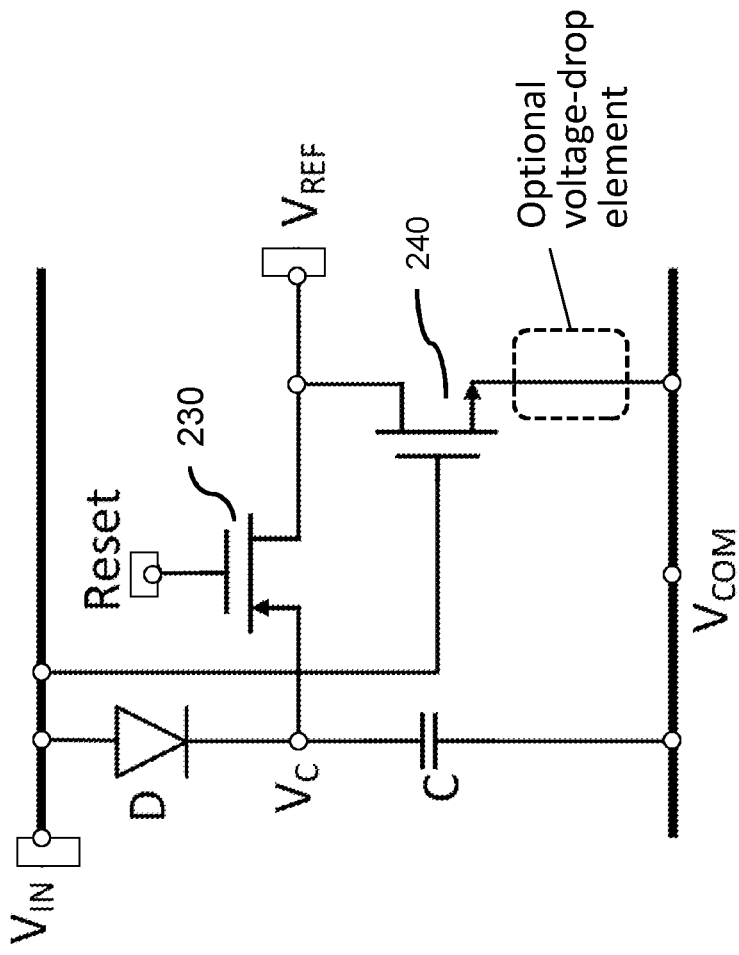
FIG. 10 is a conceptual schematic diagram illustrating an implementation of the subthreshold voltage reference of the voltage detector of FIG. 9.

FIG. 10 is an illustrative circuit implementation of the functionality of the subthreshold voltage reference in FIG. 9. It comprises a first current controlling element, diode D, and a capacitance C connected in series between the input terminal and a common reference $V_{COM}$ such that the capacitance is charged (though the diode) by the input signal. The capacitance may be a parasitic capacitance (e.g. of a transistor gate), or may be provided by a separate component such as a capacitor. The common reference may be ground.

The source of a PMOS transistor 230 is connected to a node between the diode D and capacitance C. Its drain is connected to the drain of an NMOS transistor 240, with its source connected to a common reference. A node in the connection between the drain of the PMOS transistor and the NMOS transistor provides the reference voltage output $V_{REF}$ of the reference generator. The gate of the PMOS transistor provides the reset input to the reference generator. The gate of the NMOS transistor is connected (directly) to the input terminal.

In operation, with a rising input voltage $V_{IN}$, the voltage at the node between the diode D and capacitance C ($V_C$) follows $V_{IN}$ minus the diode forward drop voltage across the diode D. With no, or a low, voltage at the Reset input the PMOS transistor 230 is on more strongly than the NMOS transistor 240 so $V_{REF}$ follows $V_C$ closely.

As $V_{IN}$ rises further, being connected to the gate of the NMOS transistor 240, it increases the (leakage) current in the NMOS transistor 240 which begins to draw an increased current resulting in $V_{REF}$ and $V_C$ reaching a plateau and ceasing to rise.

If an input is provided to the Reset terminal of sufficient voltage the PMOS transistor 230 is turned off, causing $V_{REF}$ to be shorted to the common reference via the NMOS transistor and eliminating or significantly reducing the static current path in the voltage reference, effectively putting it into a low power mode.

The two transistors in the voltage reference serve two functions, depending on the state of the reference generator. Prior to resetting the NMOS transistor 240 operates in subthreshold and thus helps generate a reference voltage together with the diode D. When in subthreshold both components allow current to flow generally exponentially with voltage. After resetting the PMOS transistor 230 power-gates off the quiescent current, and so helps reset the reference voltage to zero (or a common reference voltage).

Figure 11:
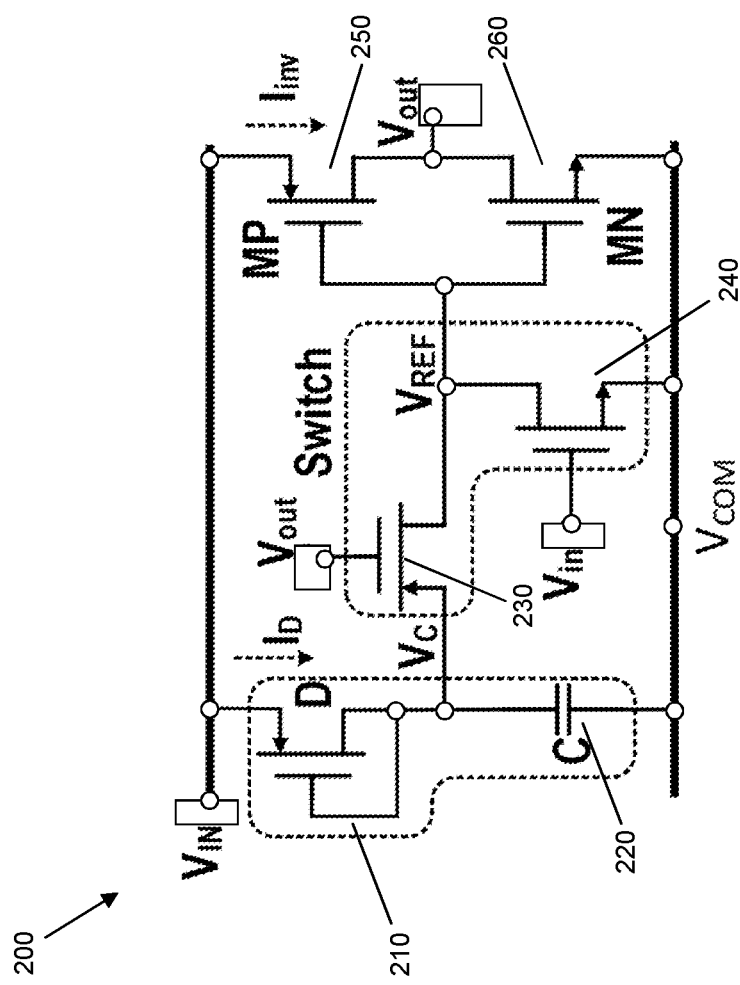
FIG. 11 is a conceptual schematic diagram illustrating a transistor implementation of the low voltage detector illustrated in FIG. 9.

FIG. 11 is an illustrative circuit implementation 200 of the functionality of the circuit shown in FIG. 9 with the voltage reference circuit implemented as shown in FIG. 10 save that, in this implementation, the diode D of FIG. 10 is a diode-connected transistor 210. As indicated above, the purpose of the diode D is simply to control current flow and so provide a voltage drop between $V_{IN}$ and $V_C$. A diode (or diode-connected transistor 210) offers a convenient way of providing a voltage drop, but it will be appreciated by those skilled in the art that any other component or circuit that provides an appropriate voltage drop could equally be employed. The capacitance of FIG. 10 is implemented by a capacitor 220 (though this need not be a separate component; as indicated above, the capacitance may be provided by parasitic capacitance in the circuit 200). The trigger is an inverter implemented by a transistor pair consisting of a PMOS transistor 250 and an NMOS transistor 260. The output of the inverter $V_{OUT}$ is connected to the gate of the PMOS transistor 230 which forms the reset input of the voltage reference circuit of which it forms a part.

Figure 13:
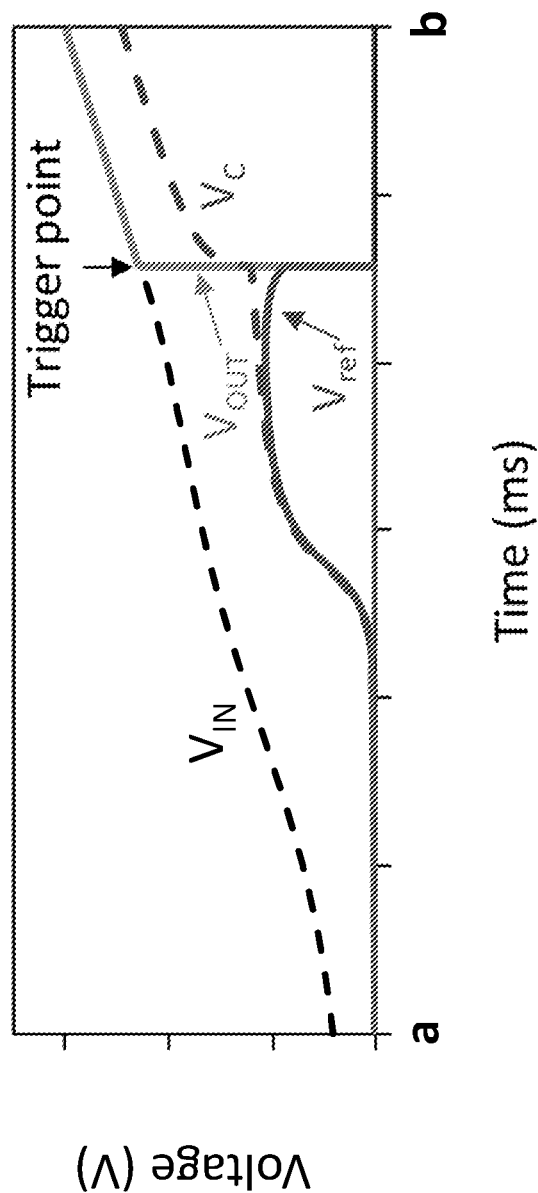
Figure 14:
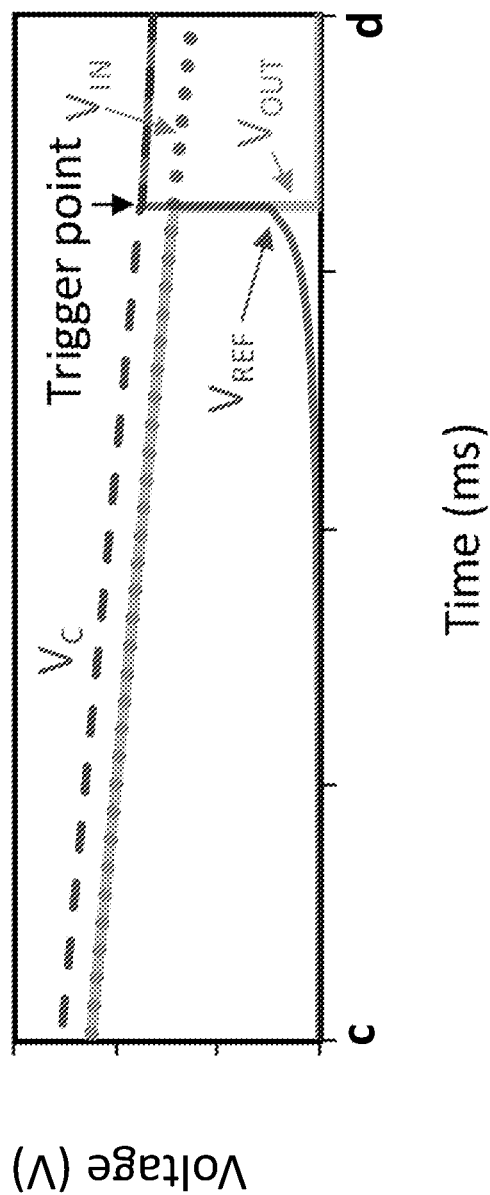

The operation of the circuit of FIG. 11 will now be described with reference to FIGS. 12 to 14, which are timing diagrams illustrating the operation of the circuit of FIG. 11. FIGS. 13 and 14 show expanded views of sections of FIG. 12. FIG. 13 shows the section between times a and b and FIG. 14 the section between times c and d, of FIG. 12, and show detail around the triggering of the inverter for rising and falling input voltages respectively.

Figure 12:
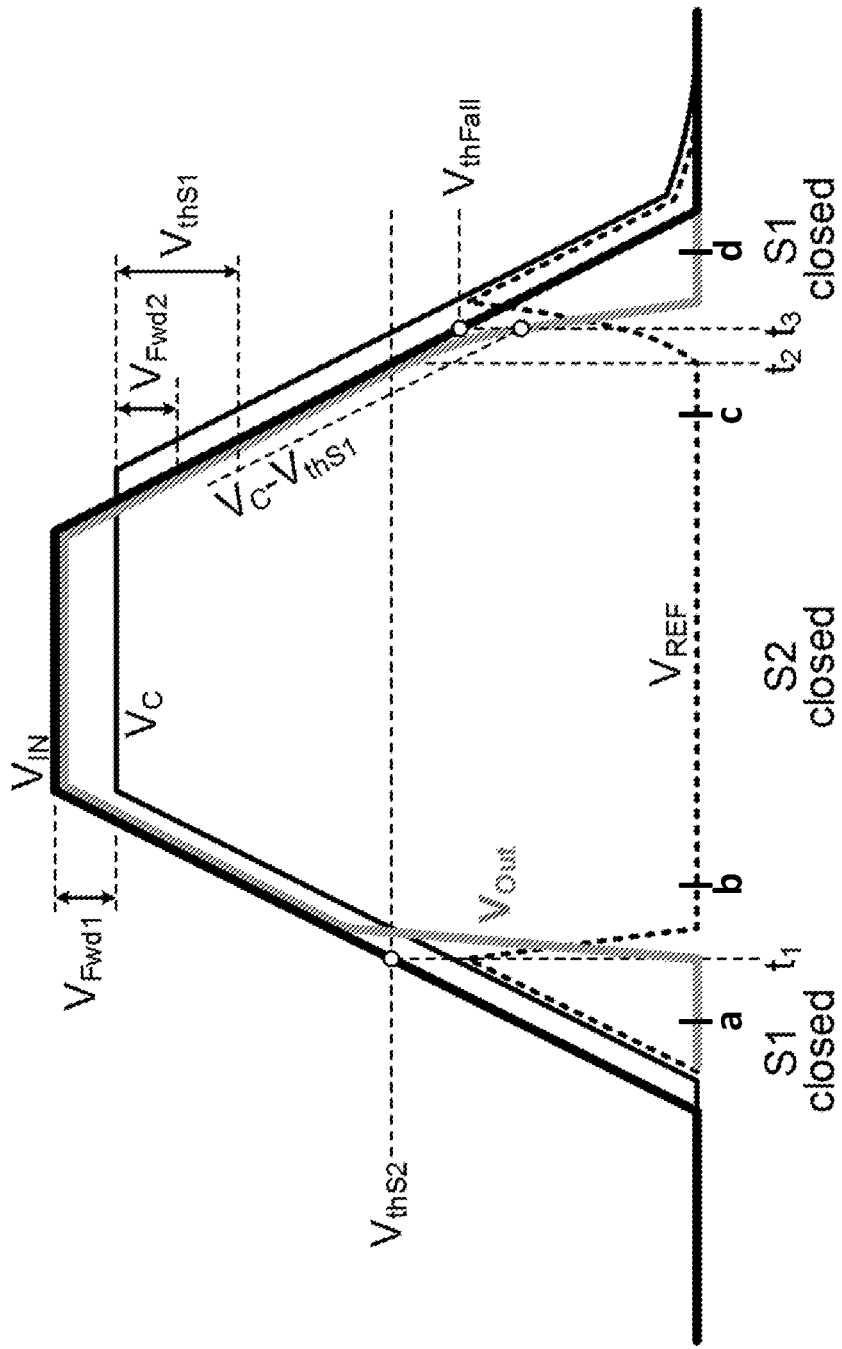
FIGS. 12 to 14 are timing diagrams illustrating the operation of the circuit of FIG. 11.

The input voltage pulse $V_{IN}$ from an external voltage source $V_{IN}$ is assumed to follow a trapezoidal profile, as shown in FIG. 12. The capacitance of the capacitor 220 is two or more orders of magnitude lower than the source's parasitic capacitance. The capacitor is charged via the diode-connected transistor 210, resulting in $V_C$ (the voltage at the node between the transistor 210 and the capacitor 220)

generally being a diode forward voltage drop $V_{Fwd1}$ below $V_{IN}$ during the rise and the plateau of the input voltage. During the fall of $V_{IN}$, the capacitor 220 discharges into the $V_{IN}$ rail through the antiparallel parasitic diode of the transistor 210, resulting in $V_C$ generally being a diode forward voltage drop $V_{Fwd2}$ above $V_{IN}$.

At the start of the pulse, $V_{OUT}$ is zero, and therefore the PMOS transistor 230 that is controlled by $V_{OUT}$ connects $V_C$ through to the input VB of the inverter formed by transistors 250, 260, forcing $V_{REF}$ to follow $V_C$. As discussed above, as $V_{IN}$ rises further the NMOS transistor 240 begins to draw increased current resulting in $V_{REF}$ reaching a plateau (this plateau being visible in FIG. 13) and ceasing to rise and thus determining the voltage threshold at which the trigger circuit switches.

The trigger is an inverter whose input is $V_{REF}$. The supply voltage $V_{IN}$ at which the inverter flips its output high is the detection threshold $V_{TH}$ of the detector. In the described implementation, on a rising $V_{IN}$, $V_{REF}$ is 0.22 V, providing a detection threshold of 0.46 V. Upon triggering, $V_{REF}$ is reset to $V_{COM}$ (which may be zero or ground), which lowers (to 0.29 V where $V_{COM}$ is zero) the threshold at which the trigger flips back, thereby providing hysteresis.

Due to the low $V_{REF}$, the trigger circuit operates in subthreshold prior to triggering. The topology of the trigger stage uses PMOS transistor 250 as a common-gate amplifier, whose gate bias is $V_{REF}$, whose input is $V_{IN}$ and whose active load is NMOS transistor 260 due to its gate being biased to $V_{REF}$. The trigger output voltage is also the $V_{DS}$ of the NMOS transistor 260. Therefore, as the $V_{DS}$ of 260 exceeds $4_{VT}$ (~100 mV=4×thermal voltage), this transistor enters saturation. Now, with both transistors 250 and 260 in saturation, the increased output impedance results in a large gain of the amplifier, seen by an increase in the gradient of the trigger output voltage. This increase turns off the PMOS transistor 230 forming part of the voltage reference with the result that very soon after the trigger output voltage begins to increase the subthreshold voltage reference circuit begins to reset, and this positive feedback leads to a sharp rise in output voltage. Also, as $V_{IN}$ reaches the gate threshold $V_{thS2}$ of the transistor 240, $V_{REF}$ is pulled to the common reference, also causing $V_{out}$ to go high, and minimising leakage through the inverter.

$V_{out}$ then follows the rail voltage $V_{IN}$ of the inverter.

On the falling edge the gate voltage of transistor 240 drops, weakening its driving strength. When $V_{IN}$ reaches the threshold $V_{thS2}$ of the transistor 240, it loses capacity to hold $V_{REF}$ low. Subthreshold leakage through the transistor 230 (stemming from charge stored by the capacitance C) causes $V_{REF}$ to rise, and therefore $V_{OUT}$ to begin falling. As $V_{REF}$ reaches 100 mV transistor 230 is conducting enough current to pull up $V_{REF}$ rapidly to $V_C$. This process is accelerated by positive feedback from the output. Once $V_{OUT}$ has fallen to $V_C - V_{th230}$ (i.e. $V_c$—the threshold of the transistor 230), the transistor 230 turns on, pulling $V_{REF}$ up to beyond the rail voltage $V_{IN}$, which in turn causes the inverter to pull $V_{OUT}$ to the common reference. Once the pulse is over, the remaining charge in the capacitor 220 leaks to the common reference through the transistor 210. In this manner a hysteresis is created between the rising and falling detection thresholds.

The steady-state current consumption of the voltage detector circuit of FIG. 11 is reduced in comparison to prior art systems by means of two features. First, the inverter's input is always pulled either high or low via the two-way switch consisting of the transistors 230, 240, which reduces the inverter's static current leakage (shown as $I_{inv}$ in FIG. 11) flowing through the transistors 250, 260. Second, the rise and fall input voltage thresholds (i.e. the voltage threshold at which the voltage detector switches on the open-drain output stage 160 in response to a rising input voltage and the voltage threshold at which the voltage detector switches off the open-drain output stage 160 in response to a falling input voltage) are provided by a circuit that draws negligible current in steady state. The rise threshold is a function of the gate voltage threshold of the NMOS transistor 240. The fall threshold is a function of the device parameters of the transistors 230, 240, 250 and 260.

Figure 15:
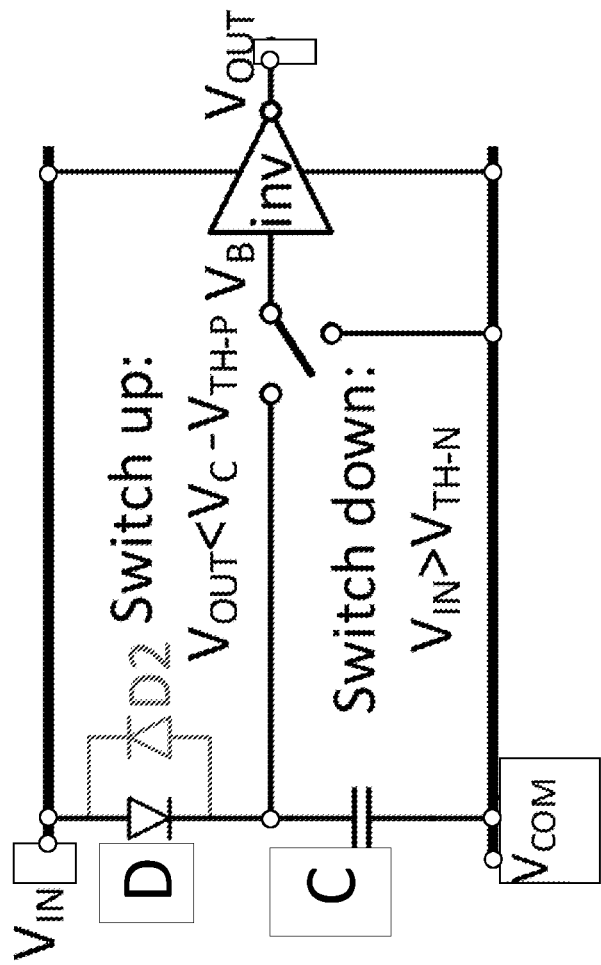
FIG. 15 is a functional block diagram illustrating aspects of the operation of the voltage detector illustrated in FIG. 9.

FIG. 15 is an alternate schematic block diagram of the voltage detector of FIG. 9, without the optional buffers, which illustrates an aspect of the operation of the detector. Here, as with FIG. 9, the subthreshold voltage reference is implemented by a diode D, and a capacitance C connected in series between the input terminal and a common reference such that the capacitance is charged (though the diode) by the input signal. The capacitance may be a parasitic capacitance (e.g. of a transistor gate of the switch), or may be provided by a separate component such as a capacitor. The difference to FIG. 9 is that the two transistors 230 and 240 are visualised as a switch S.

The operation of the switch S is such that the input of the inverter is connected to a common reference (or another low-voltage source suitable for causing the inverter to output a voltage that is sufficiently high as to switch on the open-drain output 160) when the input voltage $V_{IN}$ to the voltage detector system 100 is greater than a voltage $V_{thN}$, which is the voltage detection threshold at which the voltage detectors 144, 146 switch on the open-drain output 160 in response to a rising input voltage. The input of the inverter is connected to the node between the voltage reducing element and the capacitance during a period in which the input voltage rises from 0 to $V_{thN}$, and when the output voltage $V_{OUT}$ of the voltage detector 144, 146 is less than a voltage $V_C - V_{thP}$, where $V_C$ is the voltage across the capacitance and $V_{thP}$ is a positive value.

The second and third voltage detectors 144, 146 both operate in the manner described above in relation to FIGS. 9 to 15, only that the thresholds are lower for the third voltage detector 146 than the second voltage detector 144, and the plateau is lower while the third voltage detector 146 is power-gated off by the higher-voltage second voltage detector 144. Assuming the transient current surges during the switching events are small, and since there is no static current flow during the detection process, this architecture provides a low power consumption.

The first voltage detector 142 may have the same topology as the second and third voltage detectors 144, 146. Alternatively, the first voltage detector 142 could be parametrically redesigned to trade off speed for reduced static power consumption, since the first voltage detector 142 experiences the highest voltage of all detector levels.

Figure 16:
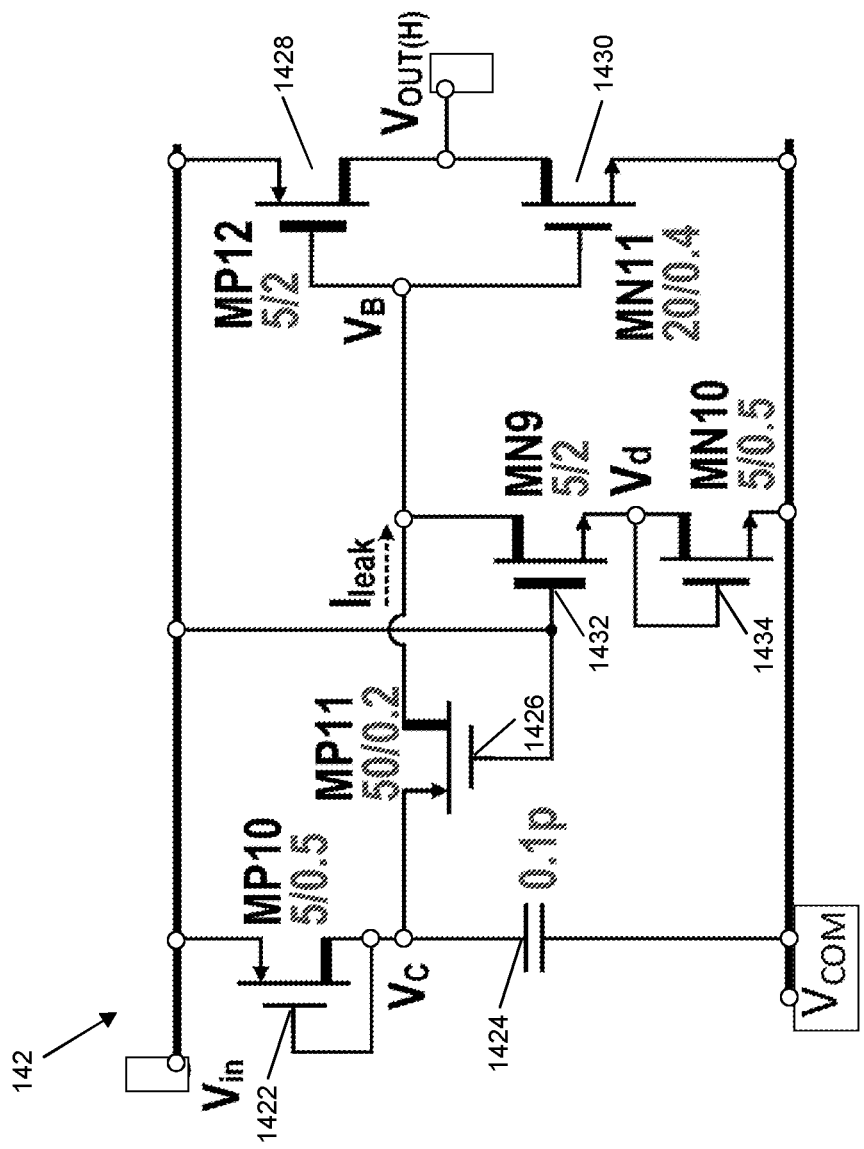
FIG. 16 is a schematic diagram showing the design of a high voltage-range voltage detector for use in the system of FIG. 5.

However, a further alternative arrangement, which is a conceptual variant of the second and third detectors, may be employed in the first voltage detector 142, as will now be described with reference to FIG. 16, which is a schematic representation of the first (high voltage range) voltage detector 142, with the relevant design parameters (component values and width/length ratios of the transistors used in the circuit) shown.

The first voltage detector 142 operates as described above in relation to the circuits of FIGS. 11 and 15, with two differences. First, the transistor, which selectively connects the input of the inverter to the capacitance is not controlled by the output signal $V_{Out}$, but is instead controlled by the input signal $V_{in}$. In FIG. 16, this is seen by the gate of transistor 1432 being connected to the $V_{in}$ rail. Second, transistor 1432 is connected in series with a voltage reducing element (represented in FIG. 16 by a diode-connected transistor 1434), which shifts the potential relative to the common reference at which the gate of transistor 1432 switches.

Referring back to the schematic representation of FIG. 11, assume that the gate threshold voltage of PMOS transistor 250 is a few hundreds of millivolts higher than the gate threshold of the NMOS switch 240. The aim is to stop an unwanted current path through transistors 210, 230 and 240 from occurring. This short circuit occurs on a rising $V_{IN}$, starting at the time when transistor 240 switches on and pulls $V_{REF}$ down. At this point $V_{IN}$ is not yet high enough for $V_{IN}$-$V_{REF}$ to have equalled the gate threshold of transistor 250. Therefore $V_{Out}$ is still low, and thus transistor 230 still on. This short circuit is only removed once 230 turns off.

Referring again to FIG. 16, the first modification is that transistor 1426, which corresponds to the NMOS switch 230 of FIG. 11, is now controlled by the detector input $V_{in}$ instead of the inverter output $V_{OUT}$. This prevents the occurrence of the short-circuit path through transistors 210, 230, and 240 in FIG. 11, by ensuring that transistor 230 is off all the time. The equivalent of transistor 230 of FIG. 11 in the arrangement shown in FIG. 16 is transistor 1426, which is now controlled by $V_{in}$ rather than $V_{OUT}$ as in the lower voltage-level detectors 144, 146, which keeps transistor 1426 off because it has a negative source-gate voltage. However, $V_{REF}$ does need to rise and follow $V_{IN}$ for correct operation. Therefore, transistor 1426 is designed with a large W/L ratio 50/0.2, in order to provide sufficient leakage current $I_{leak}$ to charge the node $V_{REF}$ in the initial phase of a $V_{IN}$ rise, as illustrated in FIG. 12 (before $t_1$). This ensures that the inverter output $V_{OUT(H)}$ is initially held low as the detector input $V_{in}$ rises from 0V. Careful design ensures that the equivalent resistance of transistor 1426 is high enough to sufficiently limit the charging current.

The second modification to counteract large gate-threshold differences, e.g. between the NMOS transistor 1432 and the PMOS transistor 1428, is the addition of the diode-connected transistor 1434. The diode-connected transistor 1434 acts as a bias-shifting element, by adding a small bias $V_d$ to the source terminal of the transistor 1432, thus raising the input voltage level at which transistor 1432 pulls $V_{REF}$ down. This reduces the aforementioned time during which a short-circuit path through 1422, 1426, and 1432 can occur. This speeds up the pulling-up of the inverter output $V_{OUT(H)}$, since $V_{in}$ is roughly one gate-threshold (of transistor 1434) higher by the time transistor 1432 turns transistor PMOS 1428 on. This determines the detection threshold of the first (high voltage range) detector 142. This threshold can be increased by adding more diode-connected transistors in series with the NMOS transistor 1432.

Each of the detectors 142, 144, 146 must only trigger when a rising Vin is high enough to actually be able to switch the respective output open-drain transistor. Equally, a falling Vin must trigger the detectors 142, 144, 146 for which the respective open drain transistors are still on.

During an input voltage pulse, the three open-drain output transistors 162, 164, 166 (FIG. 5) need to operate seamlessly to avoid any dead time in which none of the open drain output transistors are on. Seamless operation is achieved by setting both the rising and falling detection thresholds of each internal detector to exceed the gate threshold voltages of their respective open-drain output transistors: both the rising and falling thresholds of the first detector 142 are higher than the gate threshold voltage of the output transistor 162; both the rising and falling thresholds of the second detector 144 are higher than the gate threshold voltage of the output transistor 164; both the rising and falling thresholds of the second detector 146 are higher than the gate threshold voltage of the output transistor 166.

At the rising edge of the input, these parameter settings prevent, for instance, the second detector 144 output from being pulled up to an input voltage that is lower than the gate-threshold of the open-drain transistor 164 when this detector triggers; at this point, the open-drain transistor 164 is still not switched on, but the power-gating transistor 124 and hence the third detector 146 has been switched off, which results in dead time between the transistors 166 and 164. At the falling edge of the input, these parameter settings prevent, for instance, the second detector 144 output from going low too late while the input voltage has dropped below the gate-threshold of the open-drain transistor 164; at this point, the power-gating transistor 124 and hence the third detector 146 is switched on late after the open-drain transistor 164 has been switched off, which results again in dead time between the transistors 166 and 164. Similarly, these parameters avoid undesired switching between the first and second detector 142 and 144, which eliminates dead time between the transistors 162 and 164.

Figure 17:
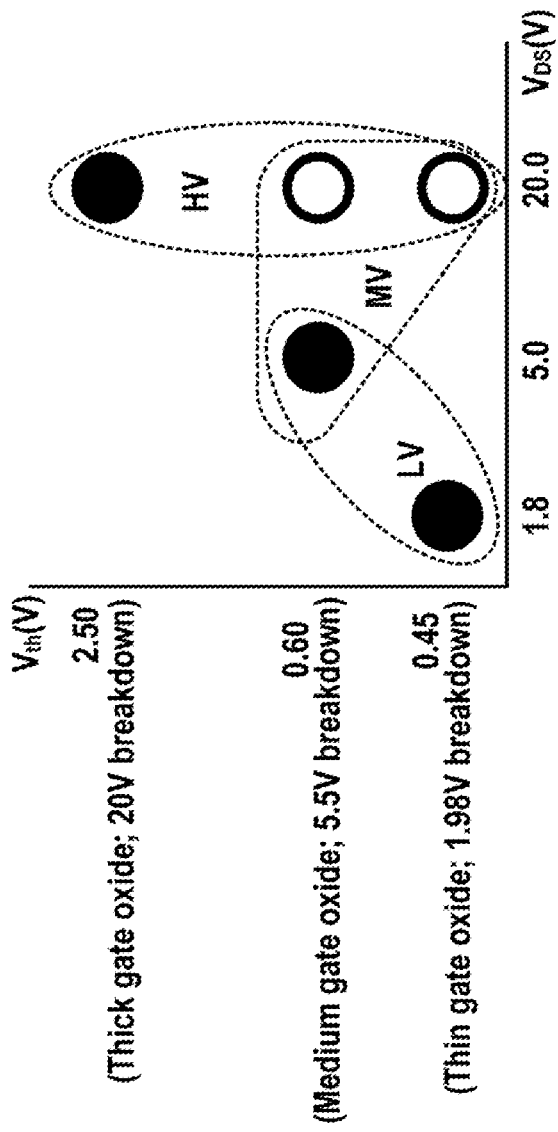
FIG. 17 is a graph illustrating parameters of devices for use in implementing the voltage detector system disclosed herein.

The three-level detector architecture of FIG. 5 places a number of demands on the fabrication process. These are illustrated in FIG. 17, which shows the nominal gate threshold and device voltage ratings of transistors chosen for the third (low voltage range), second (medium voltage range), and first (high voltage range) voltage detectors 146, 144, 142.

There are a number of reasons for choosing these transistor variants. The detector system 100 cannot be designed with only low threshold, 20 V devices of the kind indicated by the bottom-right circle in FIG. 17, as the maximum allowed voltage on the low-threshold gate is less than 5 V. In principle, the detector system 100 could be designed with 20 V devices using all thresholds, however the die size would be significantly larger, and the quiescent current would increase. Equally, the detector could be designed with the three devices shown as filled circles in FIG. 17, however the static and dynamic power consumption would increase. Therefore, in addition to these three devices, the design described here uses the other two devices enclosed by the dashed lines. The reason that three device voltage ratings are required, and why a voltage detector for medium range voltages is needed, is that the absolute maximum gate voltage of the lowest threshold gates is below the gate threshold voltage of the 20 V devices. Without a voltage detector for medium range voltages detector there would be an input voltage range that is destructive to the low threshold transistors' gates, but not able to switch the high threshold transistors to trigger a protection circuit.

The design of the second and third voltage detectors, 144, 146 will now be described, with reference to FIGS. 18 and 19, and to FIG. 20, which provides a legend of transistor symbols used in used in FIGS. 16, 18 and 19 giving transistor gate threshold options and maximum voltage ratings for an example HV CMOS fabrication process.

Figure 18:
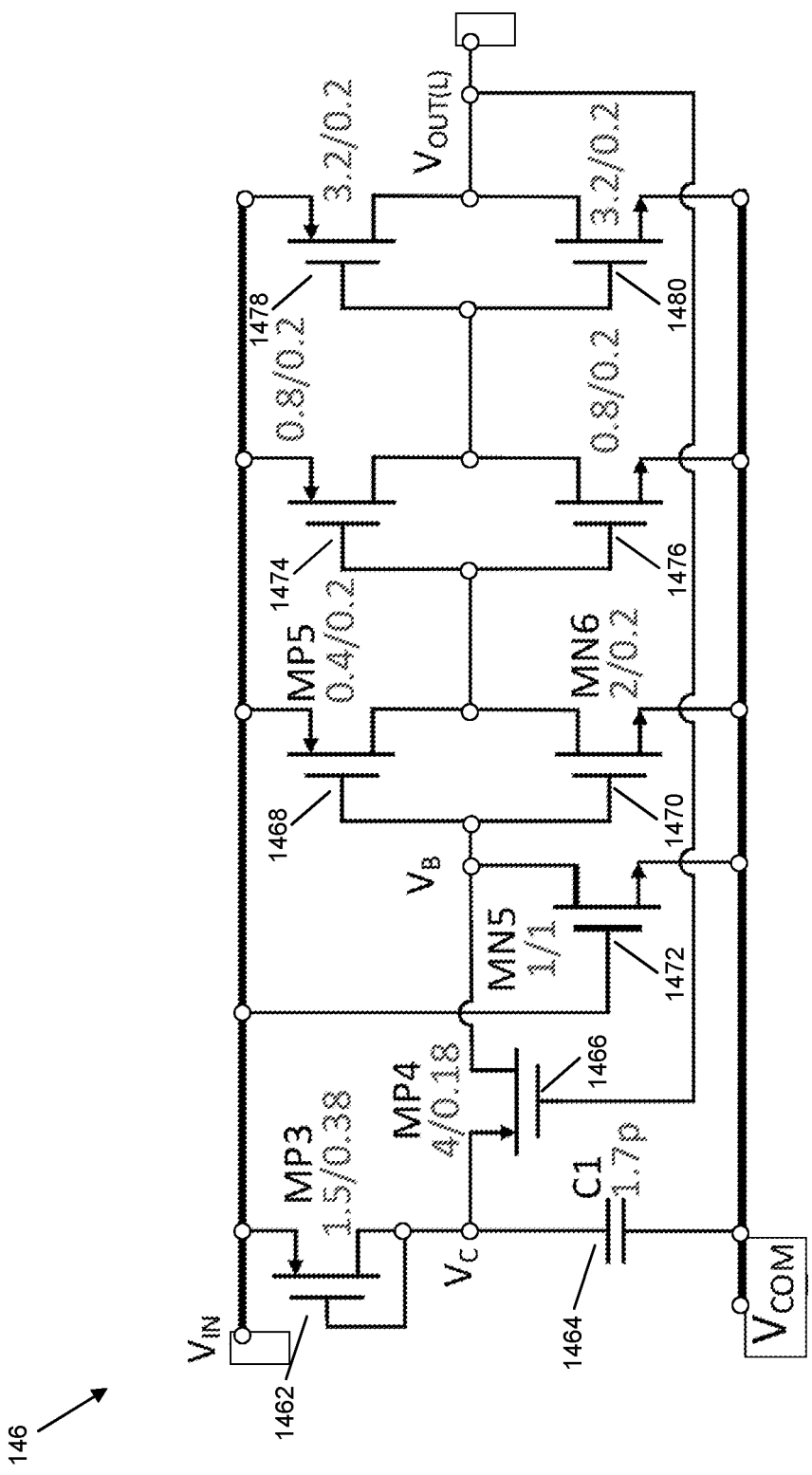
FIG. 18 is a schematic diagram showing the design of a low voltage-range voltage detector for use in the system of FIG. 5.

FIG. 18 is a schematic diagram showing the design of the third (low voltage range) voltage detector 146 with the relevant design parameters (component values and width/length ratios of the transistors used in the circuit). The operation of the third voltage detector 146 is as described above in relation to the circuit of FIG. 11. The circuit of FIG.

18 differs from that of FIG. 11 only by the presence of two additional buffers made up of pairs of transistors in the output stage.

Thus, as can be seen in FIG. 18, the third voltage detector 146 includes a diode-connected transistor 1462 (also labelled MP3 in FIG. 18) having a width/length ratio of 1.5/0.38 connected in series with a capacitor 1464 having a value of 1.7 picofarads between the input terminal of the third voltage detector 146 and a the common reference terminal of the third voltage detector 146.

A node $V_C$ at the connection between the transistor 1462 and the capacitor 1464 connects to the drain terminal of a PMOS transistor 1466 (also labelled MP4 in FIG. 18). As shown, this transistor has a width/length ratio of 4/0.18. The gate terminal of the transistor 1466 is connected to an output $V_{OUT}(L)$ of the third voltage detector 146, whilst the source terminal of the transistor 1466 is connected to a node $V_{REF}$ which connects together the gate terminals of a PMOS transistor 1468 (labelled MP5, having a width/length ratio of 0.4/0.2) and an NMOS transistor 1470 (labelled MN6, having a W/L ratio of 2/0.2) which together form an inverter.

A further NMOS transistor 1472 (labelled MN5, having a W/L ratio of 1/1) is provided, to pull the gate terminals of each of the transistors 1468, 1470 to the common reference when the input voltage is above the $V_{thN}$ threshold. Thus, the gate terminal of the transistor 1472 is connected to the input $V_{IN}$ of the third voltage detector 146, whilst its source terminal is connected to the common reference and its drain terminal is connected to the gate terminals of the transistors 1468, 1470.

As indicated above, the transistors 1468, 1470 form an inverter, whose output provides, via first and second additional output buffers (the first output buffer being formed of a transistor pair comprising a PMOS transistor 1474 and an NMOS transistor 1476 connected so as to form an inverter and the second output buffer each formed by a transistor pair comprising a PMOS transistor 1478 and an NMOS transistor 1480 connected so as to form an inverter), the output $V_{OUT(L)}$ of the third voltage detector 146.

The detection threshold of the voltage detector 146 illustrated in FIG. 18 is defined by the gate threshold voltage of the transistor 1472. The transistors 1466 and 1472 are scaled (transistor 1466 has a greater width/length ratio than transistor 1472) such that on a rising input voltage pulse when the output $V_{OUT(L)}$ is zero and both devices are in the subthreshold region, the transistor 1466 remains stronger for a while in order to allow $V_{REF}$ to rise. The threshold could be lowered by using a low-threshold device here, however this would require a much longer channel length in order to obtain the correct switch-over between transistor 1466 ('on' at the onset of an input pulse) and transistor 1472 ('off' at the start of a pulse). Transistors 1470 and 1468 (MN6 and MP5) are scaled (transistor 1470 has a greater W/L ratio than transistor 1468) so that transistor 1470 is strong enough to hold the output $V_{OUT}(L)$ low until $V_{REF}$ starts to decrease, whilst still allowing the output to be pulled up cleanly as soon as $V_{IN}$ reaches the gate threshold of transistor 1472. This is important in order to minimise the switching duration of the third voltage detector 146 and thus minimise dynamic current. The result is a rapid turn-on of the open-drain transistor 166 (FIG. 5). The output's two-stage buffer (formed by the transistor pairs 1474, 1476 and 1478, 1480) has a taper factor so that it can drive the large open-drain transistor 166 (whose width/length ratio W/L=50 μm/2 μm). The diode connected transistor 1462 (labelled MP3 in FIG. 18) is sized to allow $V_C$ to follow $V_{IN}$ and is a function of the value of the capacitor 1464, which in turn requires a minimum capacitance in order that leakage through the transistor 1466 does not discharge it during a typical input pulse.

Figure 19:
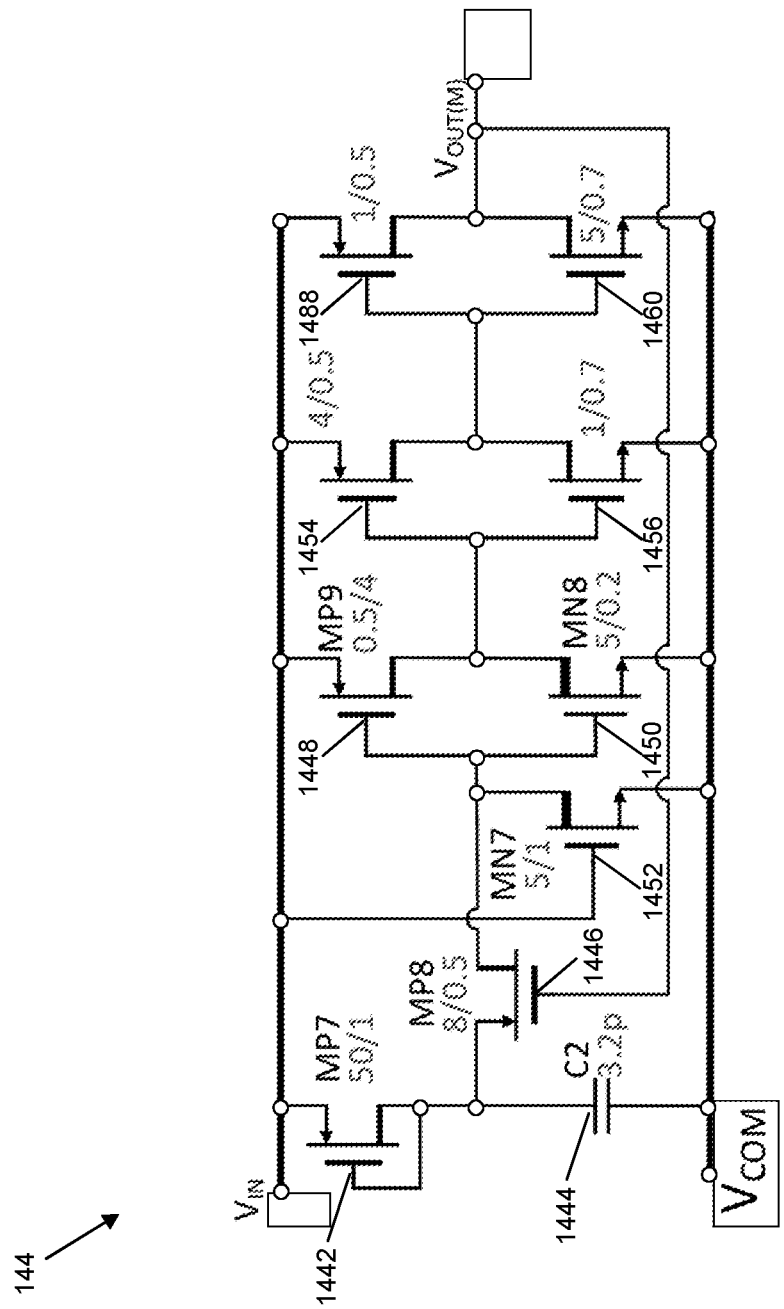
FIG. 19 is a schematic diagram showing the design of a medium voltage-range voltage detector for use in the system of FIG. 5.
Figure 20:
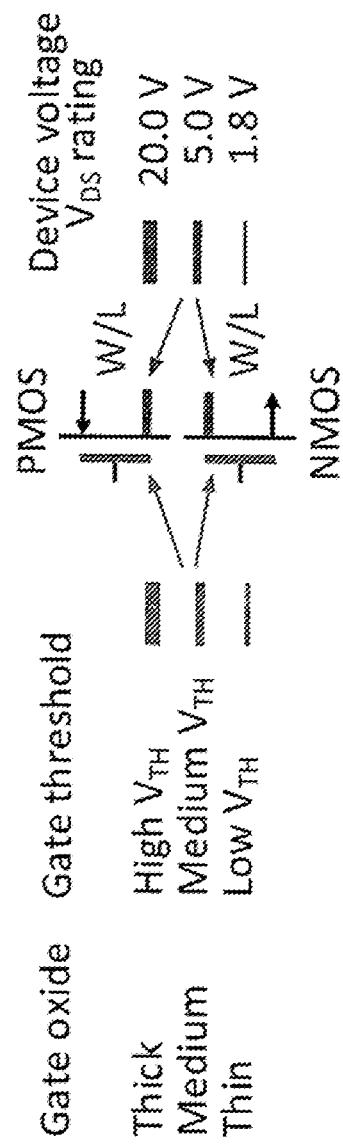
FIG. 20 provides a legend for the transistor symbols used in FIGS. 16, 18 and 19.

FIG. 19 is a schematic representation of the second (medium voltage range) voltage detector 144, again with the relevant design parameters (component values and width/length ratios of the transistors used in the circuit) shown. The operation of the second voltage detector 144 is as described above in relation to the circuit of FIG. 11. Again, the circuit of FIG. 19 differs from that of FIG. 11 only by the presence of two additional buffers made up of pairs of transistors in the output stage.

The second (medium voltage range) voltage detector 144 of FIG. 19 is designed in the same manner as the third voltage detector 146 of FIG. 18. The capacitance 1444 (labelled C2 in FIG. 19) is however larger (at 3.2 picofarads) than the capacitance 1464 of FIG. 18, as the transistor 1446 (labelled MP8 in FIG. 19, having W/L ratio 8/0.5) has higher leakage than the equivalent transistor 1466 in FIG. 18. The transistors 1446 and 1442 (MP8 and MP7, W/L ratio 50/1), in turn, are wider than their equivalents (transistors 1466 and 1462) in the third (low voltage range) voltage detector circuit of FIG. 18. They operate in subthreshold mode with a lower effective gate threshold, whilst having a medium thickness gate oxide in order to withstand the higher voltage of the medium voltage range detector 144. The transistors 1448 and 1450 (MP9, W/L ratio 0.5/4 and MN8, W/L ratio 5/0.2) which make up the inverter are scaled (transistor 1450 has a greater W/L ratio than transistor 1448) so that transistor 1448 pulls the inverter output to the common reference and therefore turns the power gating transistor 124 (labelled MP1 in FIG. 5) on, before the input voltage reaches the threshold of the third (low voltage range) voltage detector 146.

The widths of the transistors 1460, 1488 of the output stage of the second (medium voltage range) voltage detector 144 are asymmetrically scaled (i.e. the PMOS transistor 1488 has smaller W/L ratio than the NMOS transistor 1460) in order to speed up the pulling-down of the output $V_{out(m)}$. This is important during the falling-edge detection, as the power gating transistor 124 needs to be switched on as soon as the input drops below the threshold of the second (medium voltage range) detector 144 to avoid bounce in the open-drain system output $V_{OD}$.

The voltage detector system described herein combines ultra-low power consumption, low detection threshold and wide operating range. It is useful for a wide variety of applications including high- and low-side signal monitoring and power-gating, but also for low power control components such as oscillators, gate-drives, and switching devices in low-power converters. For example, due to the voltage detector system's low quiescent input current, capacitive or resistive divider circuits using 100-1000 MΩ resistors can be used to adjust the detection threshold, for example to operate a load only over a desired rail voltage band, commonly referred to as Under-Voltage Lockout. Similarly, high value MΩ pull-up resistors can be used to convert the output into a 2-level output, for example for use in ring oscillators, timers, clocks, wake-up circuits, and pulse generating circuits. This ability to use high-impedance (capacitive or resistive) peripheral components leads to control circuits that use only a few nA of current, which is important for the miniaturisation of wireless sensor nodes, wearable medical health sensors, and internet of things devices.

The above embodiments are described by way of example only. Many variations are possible without departing from the scope of the appended claims.

The invention claimed is:

1. A voltage reference circuit for receiving an input and producing an output reference voltage having a maximum value independent of a voltage of the input, the voltage reference circuit comprising:
an input for receiving the input voltage;
a first current controlling element which allows current to flow as an increasing, non-linear function of voltage at least within a first range of voltages;
a second current controlling element which allows current to flow as an increasing, non-linear function of voltage at least with a second range of voltages; and
an output at which the output reference voltage is produced,
wherein the first current controlling element and the second current controlling element are connected in series between the input and a common reference, with the second current controlling element between the first current controlling element and the common reference, the output comprises a node between the two current controlling elements, the first and second range of voltages overlap and the second current controlling element is configured to vary the function by which it allows current to flow in dependence on the input voltage;
a reset input for receiving a reset signal; and
a third current controlling element connected in series between the first current controlling element and the output,
wherein the third current controlling element is configured to allow current to flow in dependence on a voltage received at the reset input.

2. A voltage reference circuit according to claim 1 wherein the second current controlling element has a control terminal connected to the input.

3. A voltage reference circuit as claimed in claim 1 wherein the reset input is connected to the input so that the third current controlling element is configured to allow current to flow in dependence on the input voltage.

4. A voltage reference circuit according to claim 1 wherein the third current controlling element has a control terminal connected to the reset input.

5. A voltage reference circuit according to claim 1 arranged to reduce the output reference voltage when a predetermined reset signal is received.

6. A voltage reference circuit according to claim 1 comprising a capacitance connected to the input via the first current controlling element.

7. A voltage reference circuit according to claim 1 comprising a bias-shifting element associated with the second current controlling element.

8. A voltage reference circuit according to claim 1 connected to a trigger configured to compare the input voltage with the output reference voltage and to output a detection signal when the voltage of the input meets a first threshold.

9. A voltage detector for monitoring an input signal and outputting a detection signal at an output when a voltage of the input signal meets a first threshold, the voltage detector comprising:
an input configured for receiving the input signal;
a voltage reference circuit for receiving an input voltage and producing a reference voltage having a maximum value independent of the input voltage; and
a trigger configured to compare the input signal and the reference voltage and to output a detection signal to the output when the voltage of the input signal reaches the first threshold,
wherein the voltage reference circuit comprises a reset input connected to either the input or the output and is configured to reduce the reference voltage when a predetermined reset signal is received.

10. A voltage detector according to claim 9 wherein the voltage reference circuit is according to claim 1.

11. A voltage detector according to claim 9 wherein the trigger is an inverter, the voltage reference circuit comprises a capacitance connected to the input via a first current controlling element, and the voltage reference circuit acts as a switch for selectively connecting an input of the inverter to the capacitance or to a common reference, wherein:
the switch is operative to connect the input of the inverter to the capacitance during a period in which a voltage of the input signal rises from zero to the first threshold, such that no detection signal is output;
the switch is operative to connect the input of the inverter to the common reference when the voltage of the input signal meets the first threshold, such that a detection signal is output while the voltage of the input signal is equal to or greater than the first threshold; and
the switch is operative to connect the input of the inverter to the capacitance when the voltage of the input signal drops below a second threshold, such that no detection signal is output.

12. A voltage detector according to claim 9 configured to stop outputting a detection signal when a voltage of the input falls below a second threshold which is lower than the first threshold.

13. A voltage detector system for monitoring an input signal and outputting a detection signal when the voltage of the input signal meets a threshold, the voltage detector system comprising:
a first voltage detector having a first reference generator and an input for receiving the input signal and an output for outputting a detection signal, wherein the first voltage detector is configured to output the detection signal when the voltage of the input signal meets a first rising input voltage threshold;
a second voltage detector having a second reference generator and an input for receiving the input signal and an output for outputting a detection signal, wherein the second voltage detector is configured to output the detection signal when the voltage of the input signal meets a second rising input voltage threshold which is higher than the first rising input voltage threshold,
wherein the output of the second voltage detector controls a connection between the input signal and the input of the first voltage detector such that when the voltage of the input signal meets the second rising input voltage threshold the connection between the input signal and input of the first voltage detector is restricted or disconnected.

14. A voltage detector system according to claim 13 further comprising:
a third voltage detector having a third reference generator and an input for receiving the input signal and an output for outputting a detection signal, wherein the third voltage detector is configured to output the detection signal when the voltage of the input signal meets a third rising input voltage threshold which is higher than both the first rising input voltage threshold and the second rising input voltage threshold,
wherein the output of the third voltage detector controls a connection between the input signal and the input of the second voltage detector such that when the voltage of the input signal meets the third rising input voltage threshold the connection between the input signal and the input of the second voltage detector is restricted or disconnected.

15. A voltage detector system according to claim 14, wherein the third voltage detector is configured to cease outputting a detection signal when the voltage of the input signal meets a third falling input voltage threshold, wherein the third falling input voltage threshold is lower than the third rising input voltage threshold.

16. A voltage detector system according to claim 14 wherein the first, second and/or third voltage detector comprises a voltage detector according to claim 9.

17. A voltage detector system according to claim 13, wherein the first voltage detector is configured to cease outputting a detection signal when the voltage of the input signal meets a first falling input voltage threshold, wherein the first falling input voltage threshold is lower than the first rising input voltage threshold.

18. A voltage detector system according to claim 13, wherein the second voltage detector is configured to cease outputting a detection signal when the voltage of the input signal meets a second falling input voltage threshold, wherein the second falling input voltage threshold is lower than the second rising input voltage threshold.

19. A voltage detector system according to claim 13 further comprising an open drain output stage, the open drain output stage comprising a plurality of MOSFET devices, each MOSFET device having:
- a gate terminal connected to the output of a respective one of the voltage detectors;
- a source terminal connected to a common reference; and
- a drain terminal connected to an output terminal of the open drain output stage.

* * * * *